US009570180B2

(12) United States Patent
Maejima

(10) Patent No.: US 9,570,180 B2
(45) Date of Patent: Feb. 14, 2017

(54) SEMICONDUCTOR MEMORY DEVICE

(71) Applicant: KABUSHIKI KAISHA TOSHIBA, Tokyo (JP)

(72) Inventor: Hiroshi Maejima, Setagaya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/051,546

(22) Filed: Feb. 23, 2016

(65) Prior Publication Data

US 2016/0247573 A1  Aug. 25, 2016

(30) Foreign Application Priority Data

Feb. 24, 2015  (JP) .................................. 2015-033518

(51) Int. Cl.
| | |
|---|---|
| G11C 16/04 | (2006.01) |
| G11C 16/10 | (2006.01) |
| G11C 16/26 | (2006.01) |
| G11C 8/10 | (2006.01) |
| G11C 8/12 | (2006.01) |
| G11C 16/08 | (2006.01) |
| G11C 16/32 | (2006.01) |

(52) U.S. Cl.
CPC .............. *G11C 16/10* (2013.01); *G11C 8/10* (2013.01); *G11C 8/12* (2013.01); *G11C 16/0483* (2013.01); *G11C 16/08* (2013.01); *G11C 16/26* (2013.01); *G11C 16/32* (2013.01)

(58) Field of Classification Search
USPC .......................... 365/185.17, 185.18, 185.28
See application file for complete search history.

(56) References Cited

U.S. PATENT DOCUMENTS

| | | | |
|---|---|---|---|
| 5,621,684 A * | 4/1997 | Jung ...................... | G11C 16/08 |
| | | | 365/185.17 |
| 7,719,902 B2 | 5/2010 | Dong et al. | |
| 8,203,883 B2 | 6/2012 | Fujimura | |
| 2012/0320677 A1 | 12/2012 | Maejima et al. | |

* cited by examiner

*Primary Examiner* — Vu Le
(74) *Attorney, Agent, or Firm* — Patterson & Sheridan, LLP

(57) ABSTRACT

A semiconductor memory device includes a first memory block having a first memory cell transistor and a first select transistor, a second memory block having a second memory cell transistor and a second select transistor, a first select gate line that is electrically connected to a gate of the first select transistor, and a second select gate line that is electrically connected to a gate of the second select transistor. During writing of data to a memory cell transistor in the first block, a first voltage is applied to the first select gate line during a first time period, a second voltage is applied to the second select gate line during a second time period after the first time period, and a third voltage lower than the first voltage is applied to the first select gate line during a third time period after the second time period.

20 Claims, 21 Drawing Sheets

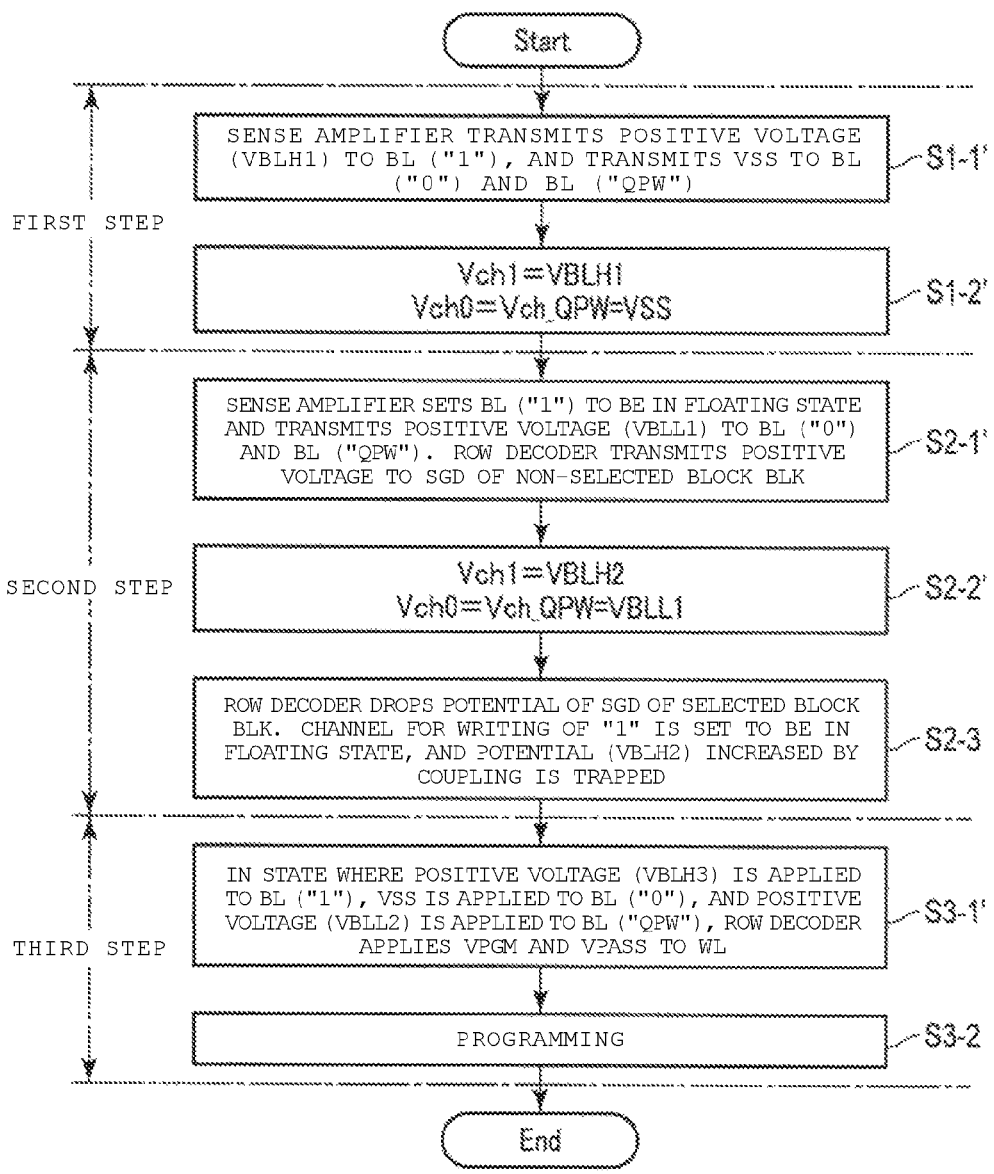

SEMICONDUCTOR MEMORY DEVICE

CROSS-REFERENCE TO RELATED APPLICATION

This application is based upon and claims the benefit of priority from Japanese Patent Application No. 2015-033518, filed Feb. 24, 2015, the entire contents of which are incorporated herein by reference.

FIELD

Embodiments described herein relate generally to a semiconductor memory device.

BACKGROUND

A NAND type flash memory is one type of a semiconductor memory device.

DESCRIPTION OF THE DRAWINGS

FIG. 16 is a flow diagram of a write operation of the semiconductor memory device according to the third embodiment.

DETAILED DESCRIPTION

Figure 1:
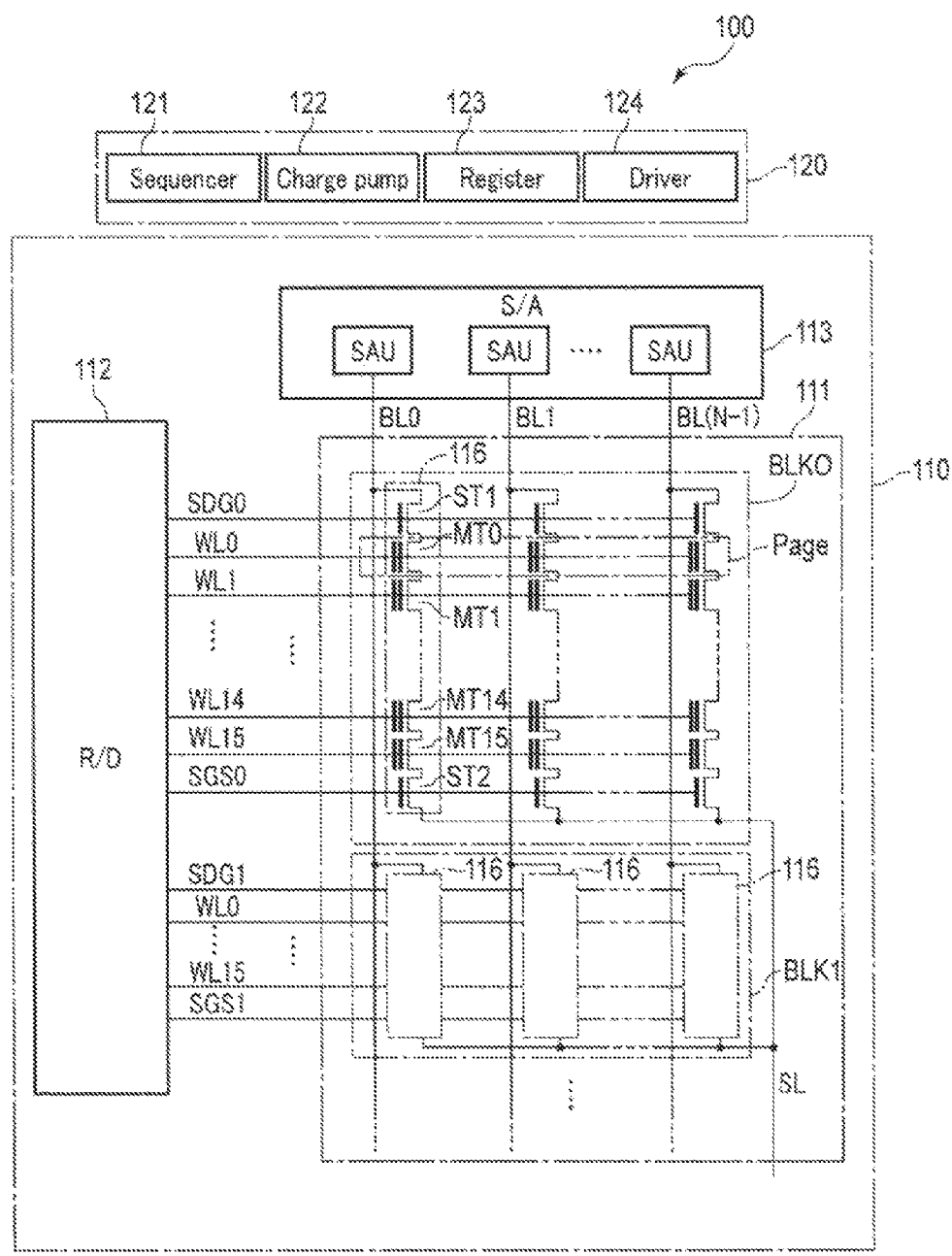
FIG. 1 is a block diagram of a semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

A semiconductor memory device capable of improving the reliability of a write operation is provided.

In general, according to one embodiment, a semiconductor memory device comprises a first block including a first memory string that includes a first memory cell transistor and a first select transistor, a second block including a second memory string that includes a second memory cell transistor and a second select transistor, a first select gate line that is electrically connected to a gate of the first select transistor, and a second select gate line that is electrically connected to a gate of the second select transistor. During writing of data to a memory cell transistor in the first block, a first voltage is applied to the first select gate line during a first time period, a second voltage is applied to the second select gate line during a second time period after the first time period, and a third voltage lower than the first voltage is applied to the first select gate line during a third time period after the second time period.

Hereinafter, embodiments will be described with reference to the accompanying drawings. In the description, common portions are denoted by the same reference numerals throughout the drawings.

1. First Embodiment

A semiconductor memory device according to a first embodiment will be described. Hereinafter, a description will be given by taking an example of a flat NAND type flash memory in which memory cell transistors are two-dimensionally arranged on a semiconductor substrate, as the semiconductor memory device.

1.1 Configuration 1.1.1 Configuration of Semiconductor Memory Device

First, the configuration of the semiconductor memory device will be described with reference to FIG. 1. As illustrated in the drawing, a NAND type flash memory 100 includes a core circuit 110 and a peripheral circuit 120.

The core circuit 110 includes a memory cell array 111, a row decoder 112, and a sense amplifier 113.

The memory cell array 111 includes a plurality of blocks BLK (BLK0, BLK1, . . . ) each of which includes a plurality of nonvolatile memory cell transistors. Data within the same block BLK are collectively erased. Alternatively, collectively data erasing is not limited to one block BLK, and a plurality of blocks BLK may be collectively erased, or some regions within one block BLK may be collectively erased.

Other data erasing techniques may be employed in the embodiments, such as data erasing disclosed in U.S. patent application Ser. No. 12/694,690, filed on Jan. 27, 2010, which is entitled "NONVOLATILE SEMICONDUCTOR MEMORY DEVICE," and data erasing disclosed in U.S. patent application Ser. No. 13/235,389, filed on Sep. 18, 2011, which is entitled "NONVOLATILE SEMICONDUCTOR MEMORY DEVICE." The entire contents of these patent applications are incorporated by reference herein.

Each of the blocks BLK includes a plurality of NAND strings 116 in each of which memory cell transistors are connected to each other in series. The memory cell transistors are two-dimensionally arrayed on a semiconductor substrate. Meanwhile, the number of NAND strings 116 included in one block is arbitrary.

Each of the NAND strings 116 includes, for example, sixteen memory cell transistors MT (MT0 to MT15) and select transistors ST1 and ST2. The memory cell transistor MT includes a stacked gate including a control gate and a charge storage layer, and stores data in a nonvolatile manner. Meanwhile, the memory cell transistor MT may be a MONOS type memory cell transistor using an insulating film for a charge storage layer, or may be an FG type memory cell transistor using a conductive film for a charge storage layer. Further, the number of memory cell transistors MT is not limited to sixteen. The number of memory cell transistors may be eight, thirty-two, sixty-four, one hundred and twenty-eight, or the like, and is not limited to any number. In this embodiment, the memory cell transistor MT may store data of one bit, that is, data "1" or data "0". In this embodiment, a state where data is erased by the extraction of charge from the charge storage layer is defined as data "1". On the other hand, a state where data is written by the injection of charge into the charge storage layer is defined as data "0". Accordingly, a threshold voltage of the memory cell transistor storing data "1" is lower than a threshold voltage of the memory cell transistor storing data "0". Meanwhile, a relationship between each data and a threshold voltage level is not limited to that described above, and may be appropriately modified. Further, the memory cell transistor MT may store data of 2 bits or more.

Current paths of the memory cell transistors MT0 to MT15 are connected to each other in series. A drain of the memory cell transistor MT0 on one end side of the series connection is connected to a source of the select transistor ST1, and a source of the memory cell transistor MT15 on the other end side is connected to a drain of the select transistor ST2.

Gates of the select transistors ST1 within the same block BLK are connected in common to the same select gate line SGD. In the example of FIG. 1, gates of the select transistors ST1 within the block BLK0 are connected in common to a select gate line SGD0, and gates of select transistors ST1, not shown in the drawing, within the block BLK1 are connected in common to a select gate line SGD1. Similarly, gates of select transistors ST2 within the same block BLK are connected in common to the same select gate line SGS.

In addition, control gates of memory cell transistors MT of the respective NAND strings 116 within the block BLK are connected in common to different word lines WL0 to WL15.

In addition, in the NAND strings 116 arranged in a matrix within the memory cell array 111, drains of select transistors ST1 of the NAND strings 116 of the same column are connected in common to one bit line BL (BL0 to BL (N−1), where (N−1) is a natural number of 1 or greater). That is, the bit line BL connects in common the NAND strings 116 across the plurality of blocks BLK. In addition, sources of select transistors ST2 within each block BLK are connected in common to a source line SL. That is, the source line SL connects in common, for example, the NAND strings 116 across the plurality of blocks BLK.

The row decoder 112 decodes an address of the block BLK and an address of a page, for example, during writing and reading of data to select a word line corresponding to a target page. The row decoder 112 applies an appropriate voltage to a selected word line WL, a non-selected word line WL, and select gate lines SGD and SGS.

The sense amplifier 113 includes a plurality of sense amplifier units SAU. The sense amplifier unit SAU is provided for each bit line BL, and senses and amplifies data read out from the memory cell transistor MT to the bit line BL during the reading of data. In addition, the sense amplifier unit transmits write data to the memory cell transistor MT during the writing of data. In addition, each of the sense amplifier units SAU includes a latch circuit for storing data. The sense amplifier unit SAU will be described later in detail.

The peripheral circuit 120 includes a sequencer 121, a charge pump 122, a register 123, and a driver 124.

The sequencer 121 controls the operation of the NAND type flash memory 100.

The charge pump 122 generates voltages necessary for the writing, reading, and erasing of data and supplies the generated voltages to the driver 124.

The driver 124 supplies voltages necessary for the writing, reading, and erasing of data to the row decoder 112, the sense amplifier 113, and the source line SL. The row decoder 112 and the sense amplifier 113 apply a voltage supplied from the driver 124 to the memory cell transistor MT.

The register 123 stores various data. For example, the register stores the status of data writing and erasing operations, and thus notifies, for example, an external controller of whether or not the operations have normally completed. Alternatively, the register 123 may store various tables.

1.1.2 Sense Amplifier

Next, the configuration of the sense amplifier 113 will be described in detail with reference to FIG. 2. In this embodiment, a current sensing type sense amplifier 113 that senses a current flowing through the bit line BL will be described as an example.

In the current sensing type sense amplifier, pieces of data are collectively read from memory cell transistors MT which are connected in common to a word line WL in any block BLK (this unit will be referred to as a "page"). Accordingly, in the sense amplifier 113 according to this embodiment, the sense amplifier unit SAU illustrated in FIG. 2 is provided for each bit line.

As illustrated in the drawing, the sense amplifier unit SAU includes a sense amplifier unit 200 and a latch circuit 210. Although only one latch circuit 210 is illustrated in FIG. 2, a plurality of latch circuits may be provided. For example, when each of the memory cell transistors MT stores data of 2 bits or more, it is preferable to provide a plurality of latch circuits.

The sense amplifier unit 200 includes a high breakdown voltage n-channel MOS transistor 40, low breakdown voltage n-channel MOS transistors 41 to 47, low breakdown voltage p-channel MOS transistors 48 to 51, and a capacitor element 58. The breakdown voltages of the transistors 41 to 51 are lower than that of the transistor 40. More specifically, the film thicknesses of gate insulating films of the transistors 41 to 51, for example, are less than that of the transistor 40.

In the transistor 40, a signal BLS is input to the gate thereof, one of the source and the drain thereof is connected to the corresponding bit line BL, and the other one is connected to a node BLI. In the transistor 41, a signal BLC is input to the gate thereof, one of the source and the drain thereof is connected to the node BLI, and the other one is connected to a node COM2. The transistor 41 is used to clamp the corresponding bit line BL to a potential based on the signal BLC.

In the transistor 42, a signal BLX is input to the gate thereof, one of the source and the drain thereof is connected to a power supply, and a power supply voltage VDDSA is applied from the power supply. In addition, the other one of the source and the drain is connected to a node COM1.

In the transistor 43, a node LAT is connected to the gate thereof, one of the source and the drain thereof is connected to the node COM1, and the other one is connected to the node COM2. In the transistor 48, a node INV is connected to the gate thereof, one of the source and the drain thereof is connected to the node COM1, and the other one is connected to the node COM2. The transistors 43 and 48 serve as first switches that switch between an on state and an off state in accordance with data stored in the latch circuit 210.

In the transistor 44, a node INV is connected to the gate thereof, one of the source and the drain thereof is connected to the node COM2, and the other one is connected to a node SRCGND. The node SRCGND is connected to, for example, the driver 124, and transmits voltages necessary for the sense amplifier unit SAU, for example, a ground potential VSS and the like. In the transistor 49, a node LAT is connected to the gate thereof, one of the source and the drain thereof is connected to the node COM2, and the other one is connected to the node SRCGND. The transistors 44 and 49 serve as second switches that switch between an on state and an off state in accordance with data stored in the latch circuit 210.

In the transistor 45, a signal HLL is input to the gate thereof, one of the source and the drain thereof is connected to a power supply, and the other one is connected to a node SEN. In the transistor 46, a signal XXL is input to the gate thereof, one of the source and the drain thereof is connected to the node SEN, and the other one is connected to the node COM1. In the capacitor element 58, one electrode is connected to the node SEN, and a clock signal CLK is input to the other electrode. In the transistor 50, a signal STBn is input to the gate thereof, one of the source and the drain thereof is connected to a power supply, and the other one is connected to the transistor 51. In the transistor 51, the node SEN is connected to the gate thereof, one of the source and the drain thereof is connected to the transistor 50, and the other one is connected to the node INV. In the transistor 47, a signal RST_N is input to the gate thereof, one of the source and the drain thereof is connected to the node INV, and the other one is connected to a bus LBUS.

Next, the latch circuit 210 will be described. The latch circuit 210 includes low breakdown voltage n-channel MOS transistors 52 to 54 and low breakdown voltage p-channel MOS transistors 55 to 57.

In the transistor 55, a signal RST_P is input to the gate thereof, one of the source and the drain thereof is connected to a power supply, and the other one is connected to the transistor 56. In the transistor 56, a node LAT is connected to the gate thereof, one of the source and the drain thereof is connected to the transistor 55, and the other one is connected to a node INV. In the transistor 52, the node LAT is connected to the gate thereof, one of the source and the drain thereof is connected to the node INV, and the other one is connected to the transistor 53. In the transistor 53, a signal STBn is input to the gate thereof, one of the source and the drain thereof is connected to the transistor 52, and the other one is connected to ground. In the transistor 57, the node INV is connected to the gate thereof, one of the source and the drain thereof is connected to the power supply, and the other one is connected to the node LAT. In the transistor 54, the node INV is connected to the gate thereof, one of the source and the drain thereof is connected to the node LAT, and the other one is connected to ground.

In the latch circuit 210, the transistors 52 and 56 form a first inverter, and the transistors 54 and 57 form a second inverter. The node INV is connected to an output of the first inverter and an input of the second inverter, and the node LAT is connected to an input of the first inverter and an output of the second inverter. Therefore, in the latch circuit 210, data is stored in the node LAT, and the inverted data thereof is stored in the node INV.

Next, operations of the first and second switches during data writing will be briefly described with reference to FIGS. 3 and 4.

Figure 3:
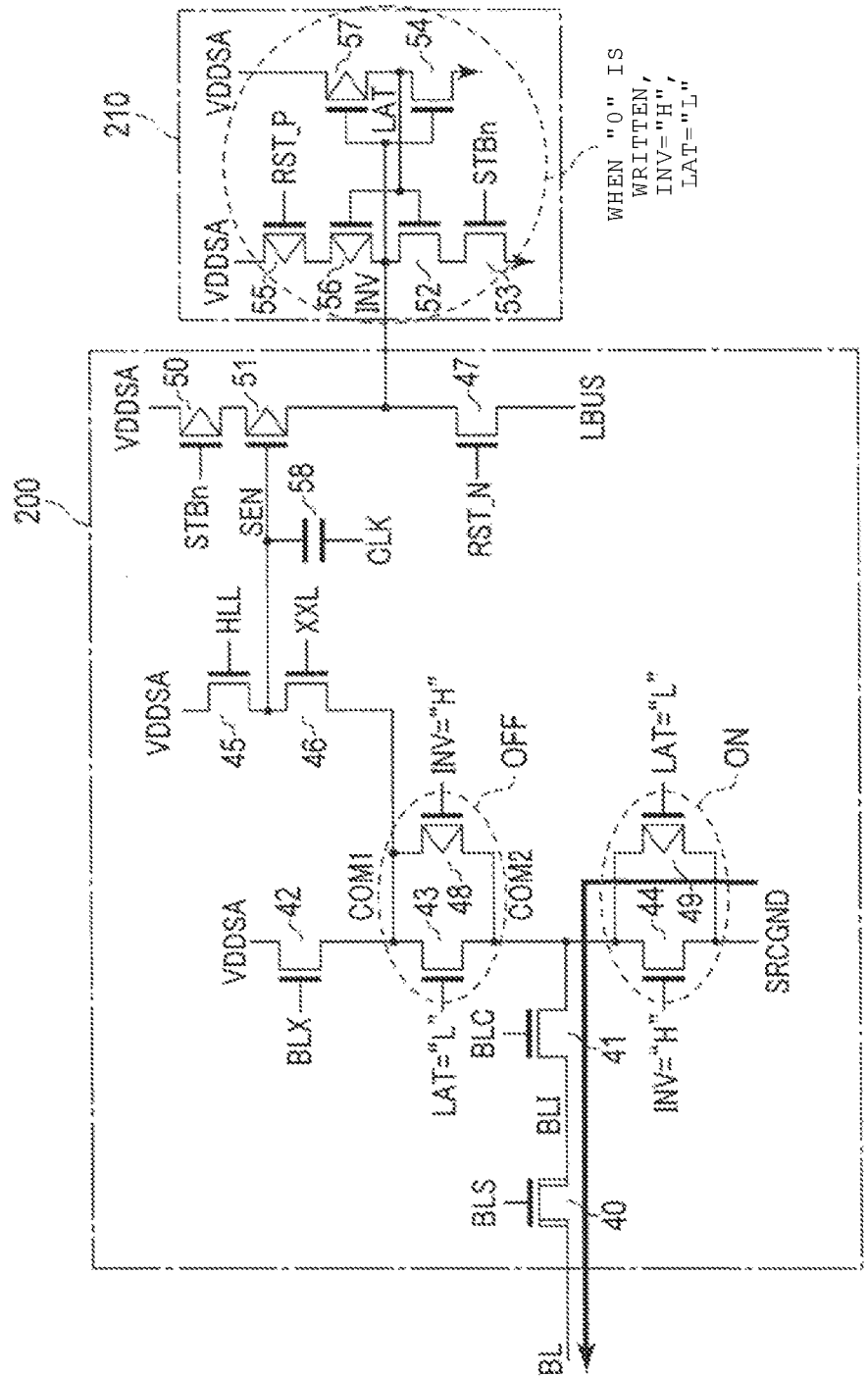
FIG. 3 is a diagram illustrating an operation of the sense amplifier unit included in the semiconductor memory device according to the first embodiment.

When data "0" is written in the memory cell transistor MT (when a threshold voltage is increased by the injection of charge), an "L" level is applied to a node LAT of the latch circuit 210, and an "H" level is applied to a node INV thereof, as illustrated in FIG. 3. As a result, the transistors 43 and 48 which are first switches are set to be in an off state, the transistors 44 and 49 which are second switches are set to be in an on state, and a bit line BL is applied with, for example, VSS from the node SRCGND.

Figure 4:
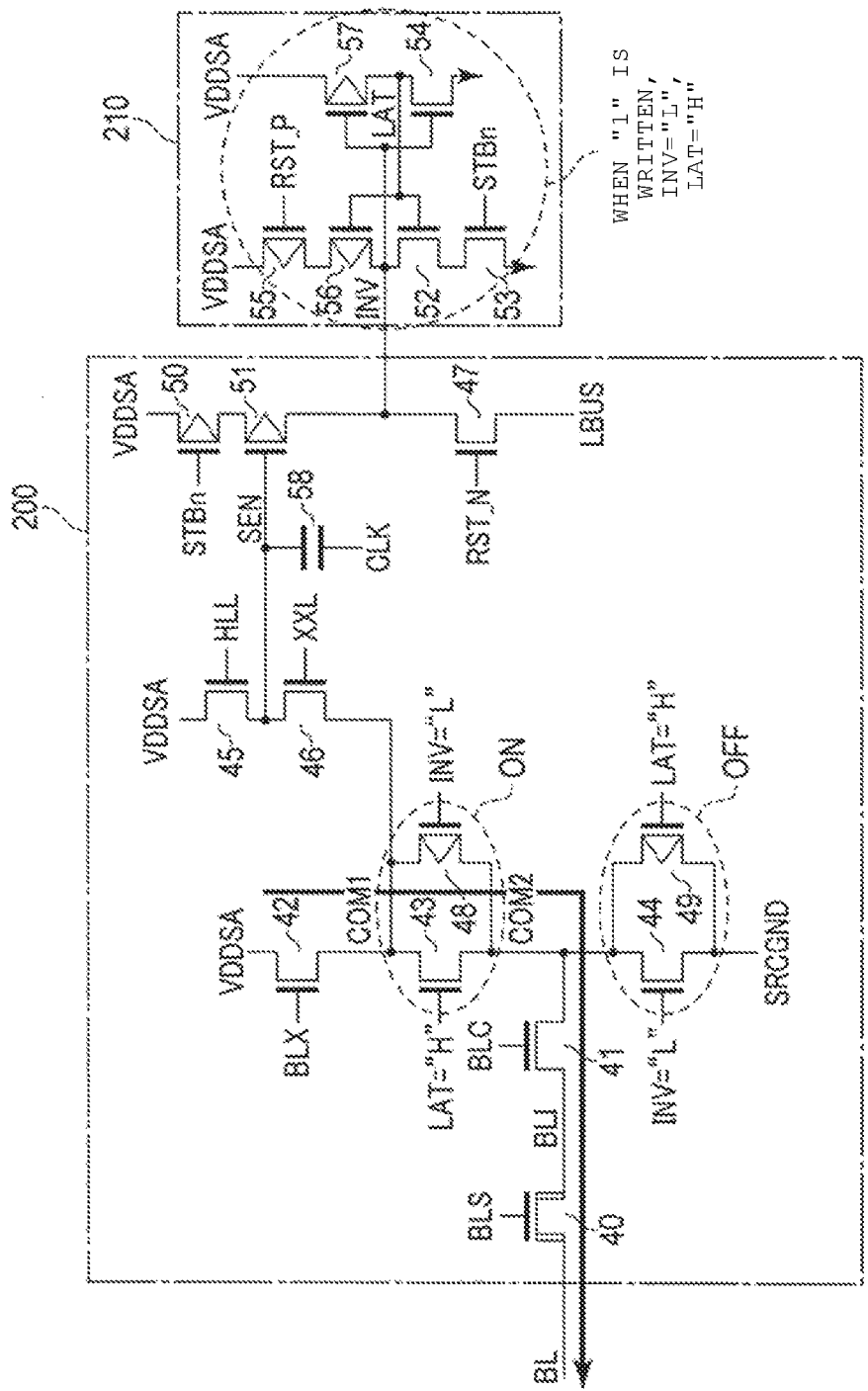
FIG. 4 is a diagram illustrating an operation of the sense amplifier unit which is included in the semiconductor memory device according to the first embodiment.

On the other hand, when data "1" is written to the memory cell transistor MT (when charge is not injected and a threshold voltage is not changed), an "H" level (data "1") is applied to the node LAT of the latch circuit 210, and an "L" level (data "0") is applied to the node INV thereof, as illustrated in FIG. 4. As a result, the transistors 43 and 48 which are first switches are set to be in an on state, the transistors 44 and 49 which are second switches are set to be in an off state, and the bit line BL is applied with a positive voltage (for example, a voltage obtained by clamping VDDSA by the transistor 41).

1.2 Data Write Operation

Next, a data write operation according to this embodiment will be described.

1.2.1 Write Operation According to this Embodiment

First, a concept of a write operation will be described with reference to FIG. 5, particularly focusing on a bit line BL and a potential of a channel. The write operation in this embodiment includes three steps. Hereinafter, a bit line corresponding to the memory cell transistor MT in which data "0" is written is referred to as BL ("0"), and a bit line corresponding to the memory cell transistor MT in which data "1" is written is referred to as BL ("1").

First Step

First, a first step will be described. In the first step, the sense amplifier 113 transmits a voltage to a channel within the NAND string 116 through a bit line BL.

Figure 2:
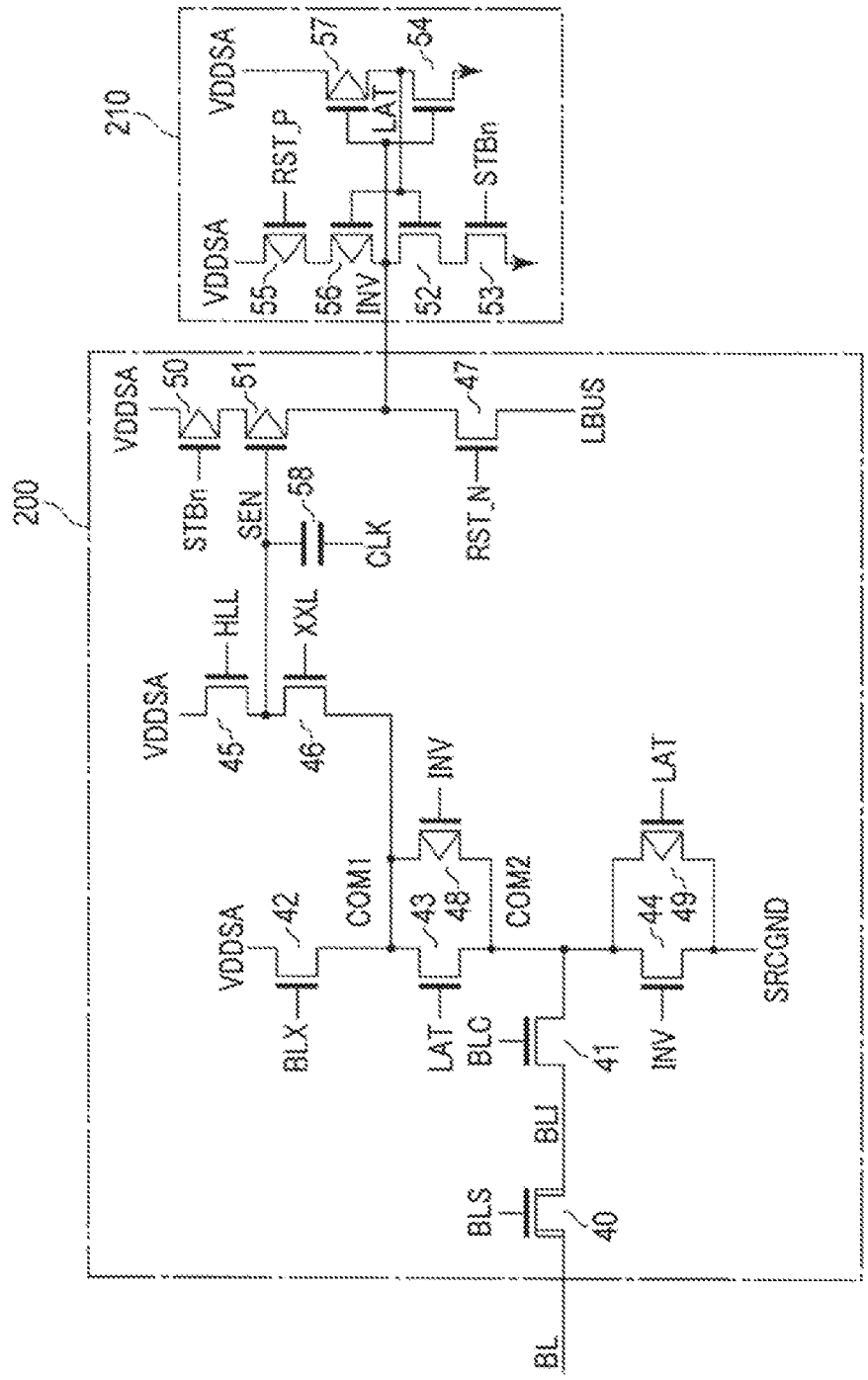
FIG. 2 is a circuit diagram of a sense amplifier unit which is included in the semiconductor memory device according to the first embodiment.

That is, in a state where the select transistor ST1 is turned on, the sense amplifier 113 applies a positive voltage VBLH1 (for example, 1.5 V) to a bit line BL ("1") and applies VSS (for example, 0 V) to a bit line BL ("0") as described in FIGS. 2 and 3 (step S1-1). As a result, a channel potential Vch1 of the NAND string 116 corresponding to the bit line BL ("1") is set to VBLH1, and a channel potential Vch0 of the NAND string 116 corresponding to the bit line BL ("0") is set to VSS (step S1-2).

Second Step

In a second step, the potential of the bit line BL ("1") increases by capacitive coupling with a bit line BL ("0"), a source line SL, and a select gate line SGD of a non-selected block BLK.

That is, in a state where the bit line BL ("1") is electrically disconnected from the sense amplifier 113, the potential of the source line SL increases to VSRC (for example, 1.5 V), the potential of the bit line BL ("0") increases to VBLL1 (for example, 1 V), and the potential of the select gate line SGD of the non-selected block BLK increases to VUSGD1 (for example, 0.8 V) (step S2-1). As a result, a channel potential Vch1 increases to VBLH2 (for example, 2.5 V), and a channel potential Vch0 increases to VBLL1 (step S2-2).

The potential of a select gate line SGD of a selected block BLK drops, and a select transistor ST1 of the NAND string 116 corresponding to the bit line BL ("1") is set to be in a cut-off state. As a result, a channel of the NAND string 116 is in an electrically floating state, and VBLH2 of the channel potential Vch1 is trapped in the NAND string 116 (step S2-3).

In addition, the potential of the bit line BL ("0") is returned to VSS, and thus the channel potential Vch0 is set to VSS.

Third Step

In a third step, a voltage is applied to a word line WL, and thus data is written in the memory cell transistor MT.

That is, the row decoder 112 applies a program voltage VPGM (for example, 20 V) to a selected word line WL, and applies a voltage VPASS (for example, 7V, VPGM>VPASS) to a non-selected word line WL (step S3-1). As a result, a channel potential Vch0 maintains VSS, while a channel potential Vch1 is boosted to a voltage Vbo by coupling with a word line WL.

Thereby, electrons are injected into a charge storage layer of a memory cell transistor MT corresponding to a bit line BL ("0"), and a threshold voltage of the memory cell transistor MT increases. On the other hand, a smaller number of electrons than those for the memory cell transistor MT corresponding to the bit line ("0") is injected to a charge storage layer of a memory cell transistor corresponding to a bit line BL ("1") to such a degree that a threshold voltage is not made to transition, and a threshold voltage does not increase much (step S3-2).

1.2.2 Details of Write Operation

Next, the above-mentioned data write operation will be described in detail with reference to FIGS. 6 to 11.

First Step

Figure 6:
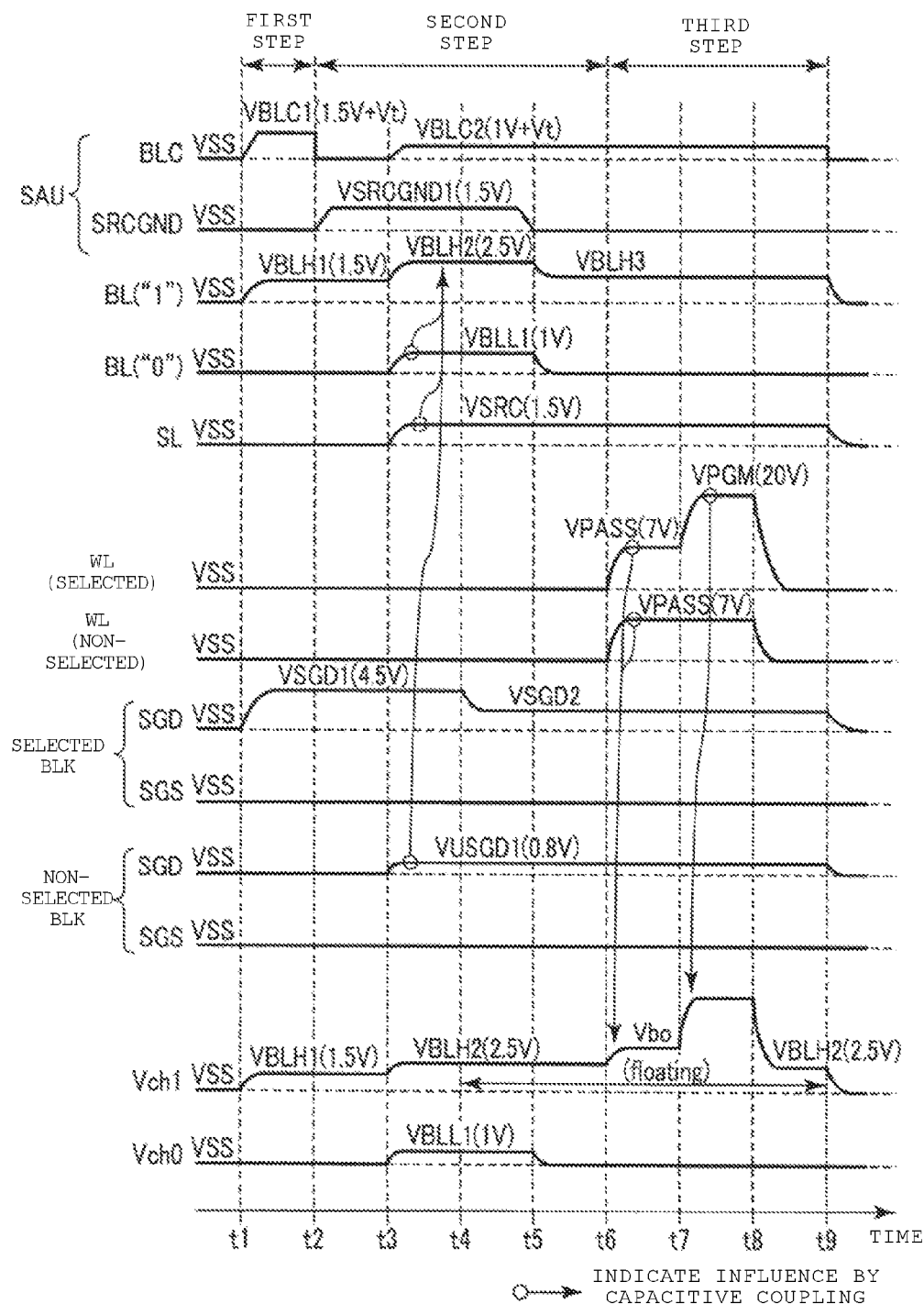
FIG. 6 is a timing diagram illustrating a potential of various lines during writing of the semiconductor memory device according to the first embodiment.
Figure 7:
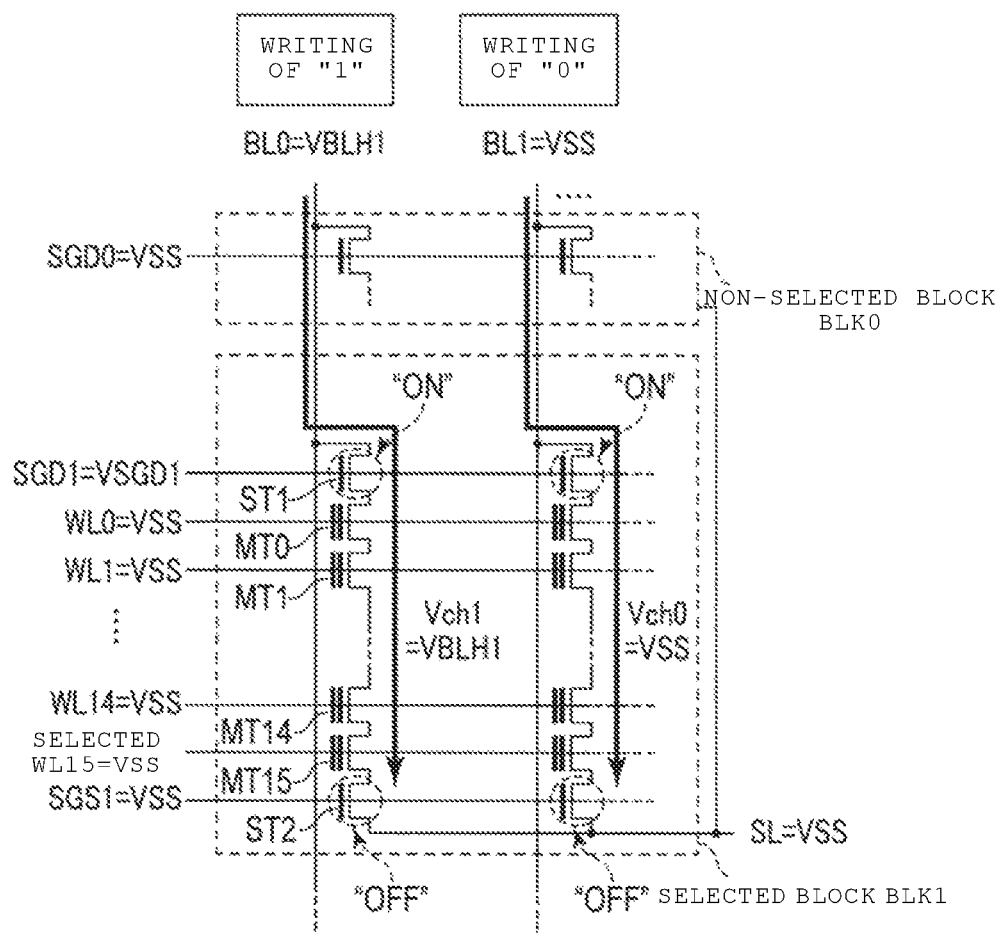
FIGS. 7-11 are diagrams illustrating states of various lines during writing of the semiconductor memory device according to the first embodiment.

First, a first step is started at time t1. This state is illustrated in FIG. 7. As illustrated in FIGS. 6 and 7, first, the sequencer 121 sets a voltage of a signal BLC to VBLC1 (for example, 1.5 V+Vt) (Vt is a threshold voltage of a low breakdown voltage n-channel MOS transistor within a sense amplifier unit SAU) at time t1. The voltage VBLC1 and a power supply voltage VDDSA supplied to the sense amplifier unit SAU have a relation of VDDSA>(VBLC1–Vt).

Thereby, the sense amplifier unit SAU applies a voltage VBLH1 (1.5 V) which is clamped by the transistor 41 to a bit line BL ("1"). Here, VBLH1 and VBLC1 have a relation of VBLH1=VBLC1–Vt. On the other hand, the sense amplifier unit SAU applies VSS, which is transmitted from a node SRCGND, to a bit line BL ("0").

In addition, the row decoder 112 applies a voltage VSGD1 (for example, 4.5 V) to a select gate line SGD of a selected block BLK to thereby set a select transistor ST1 of a selected block BLK to be in an on state. Thereby, a bit line BL transmits a voltage to the NAND string 116 of the selected block BLK. Specifically, in the selected block BLK, a voltage VBLH1 (1.5 V) is transmitted to a channel of the NAND string 116 connected to the bit line BL ("1"), and VSS is transmitted to a channel of the NAND string 116 connected to the bit line BL ("0"). In addition, the row decoder 112 applies VSS to all select gate lines SGS of selected and non-selected blocks BLK, and sets all select transistors ST2 to be in an off state.

Second Step

Next, a second step is started at time t2. At time t2, the sequencer 121 applies VSS to a signal line BLC to thereby set the transistor 41 to be in an off state, and electrically disconnects the sense amplifier unit SAU and the bit lines BL from each other. Thereby, all of the bit lines BL and the NAND string 116 are set to be in an electrically floating state. In addition, the sequencer 121 applies a voltage VSRCGND1 (for example, 1.5 V) to the node SRCGND.

Next, at time t3, the sequencer 121 sets a voltage of the signal BLC to VBLC2 (for example, 1 V+Vt). Here, VSRCGND1 and VBLC2 have a relation of VSRCGND1>VBLC2−Vt.

Figure 8:
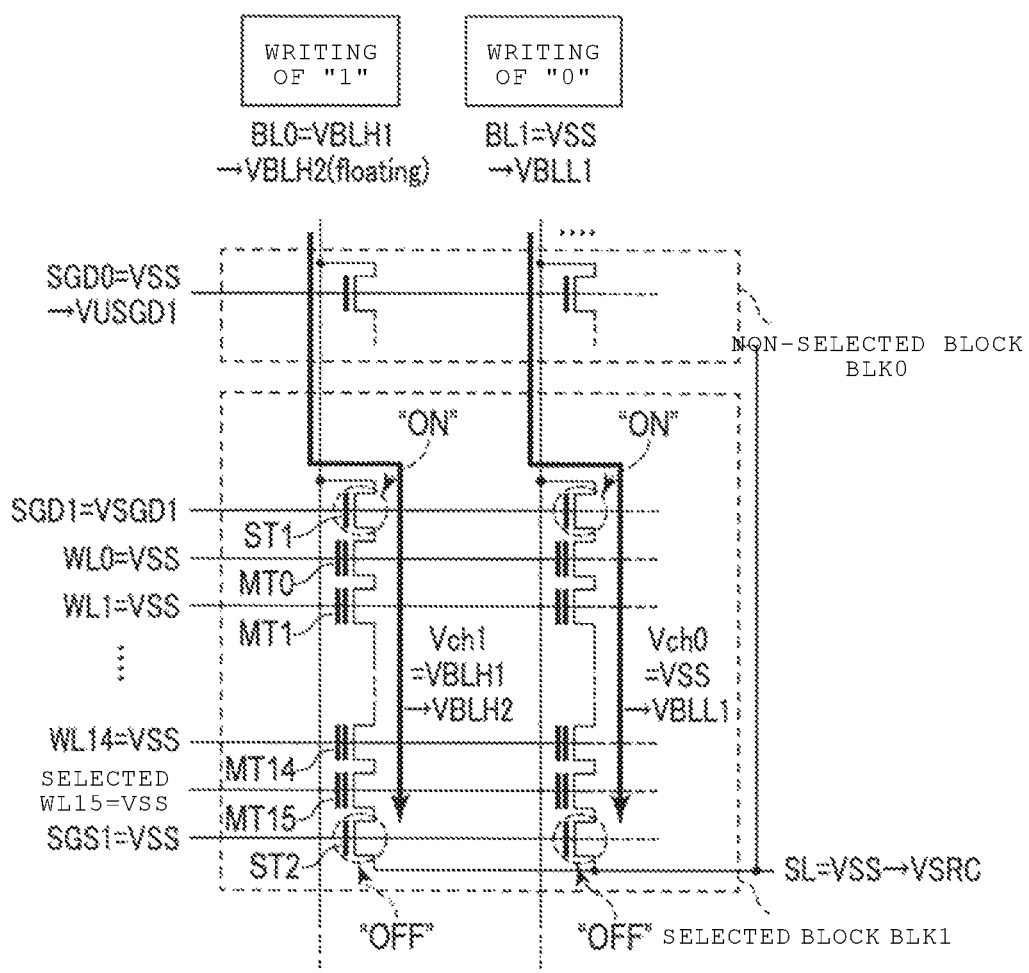

The state at time t3 is illustrated in FIG. 8. The bit line BL ("0") has a potential of VSS at time t2 and has a relation of VSS<VBLC2−Vt. For this reason, the transistor 41 connected to the bit line ("0") is set to be in an on state. Accordingly, the sense amplifier unit SAU applies VBLL1 (for example, 1 V, VBLL1=VBLC2−Vt) to the bit line ("0").

On the other hand, the bit line BL ("1") has a potential of VBLH1 at time t2, and has a relation of VBLH1>VBLC2−Vt. For this reason, the transistor 41 which is connected to the bit line ("1") is maintained to be in a cut-off state. Accordingly, the bit line BL ("1") is maintained to be in a floating state.

In this state, the driver 124 applies a voltage VSRC (for example, 1.5 V, VSRC>VSS) to a source line SL. Further, the row decoder 112 applies a voltage VUSGD1 (for example, 0.8 V, VUSGD1>VSS) to a select gate line SGD of a non-selected block BLK. Meanwhile, when a threshold voltage of a select transistor ST1 is set as Vt_st, it is preferable that VUSGD1 is set to have a relation of VUSGD1<Vt_st so that the select transistor ST1 is not set to be in an on state.

As a result, the potential of the bit line BL ("1") increases to a voltage VBLH2 (for example, 2.5 V, VBLH2>VBLH1) by capacitive coupling between a potential VBLL1 (for example, 1 V) of the bit line BL ("0"), a potential VSRC (for example, 1.5 V) of the source line SL, and a potential VUSGD1 (for example, 0.8 V) of the select gate line SGD of the non-selected block BLK. Here, VBLH2 and VDDSA have a relation of VBLH2>VDDSA.

In addition, since the select transistor ST1 is set to be in an on state, a channel potential Vch0 is set as VBLL1 in the same manner as the bit line BL ("0"). Similarly, a channel potential Vch1 is set as VBLH2 in the same manner as the bit line BL ("1").

Figure 9:
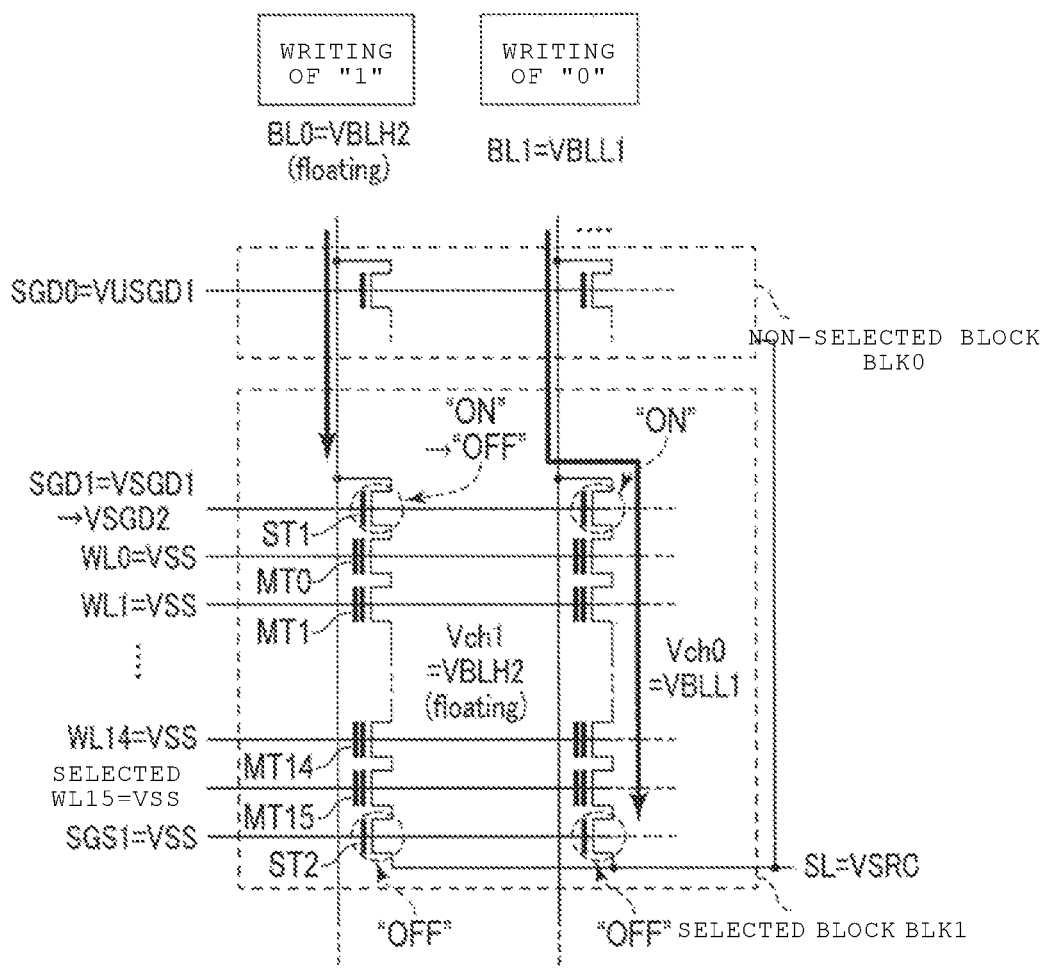

Next, at time t4, the row decoder 112 applies a voltage VSGD2 to a selected select gate line SGD. This state is illustrated in FIG. 9. The voltage VSGD2 sets the select transistor ST1 connected to the bit line BL ("0") to be in an on state, and sets the select transistor ST1 connected to the bit line BL ("1") to be in a cut-off state. Accordingly, VSGD2 has a relation of VBLL1+Vt_st<VSGD2<VBLH2+Vt_st. Thereby, in the selected block BLK, a channel of a NAND string 116 corresponding to the bit line BL ("1") is set to be in a floating state because of the select transistor ST1 being set to be in an off state, and the channel potential Vch1 is maintained to be VBLH2.

Figure 10:
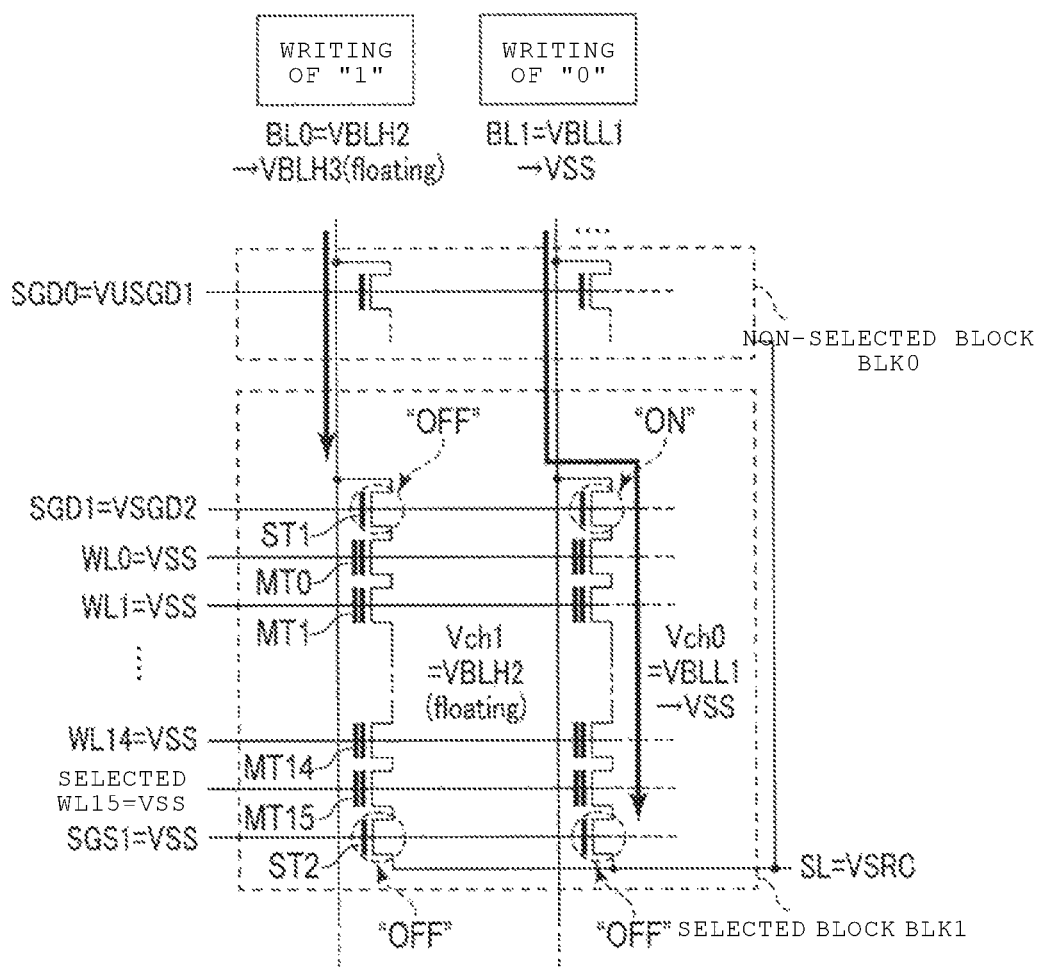

Next, at time t5, the sequencer 121 returns the potential of the node SRCGND to VSS. This state is illustrated in FIG. 10. Thereby, the potential of the bit line BL ("0") is also returned to VSS, and the channel potential Vch0 of the corresponding NAND string 116 is also set to VSS. On the other hand, since the potential of the bit line BL ("0") drops, the potential of the bit line BL ("1") is set as voltage VBLH3 by influence of capacitive coupling. Meanwhile, a relation of VBLH1<VBLH3≤VBLH2 is established. However, since the select transistor ST1 is in an off state, the channel potential Vch1 of the NAND string 116 corresponding to the bit line BL ("1") is maintained to be VBLH2.

Third Step

Figure 11:
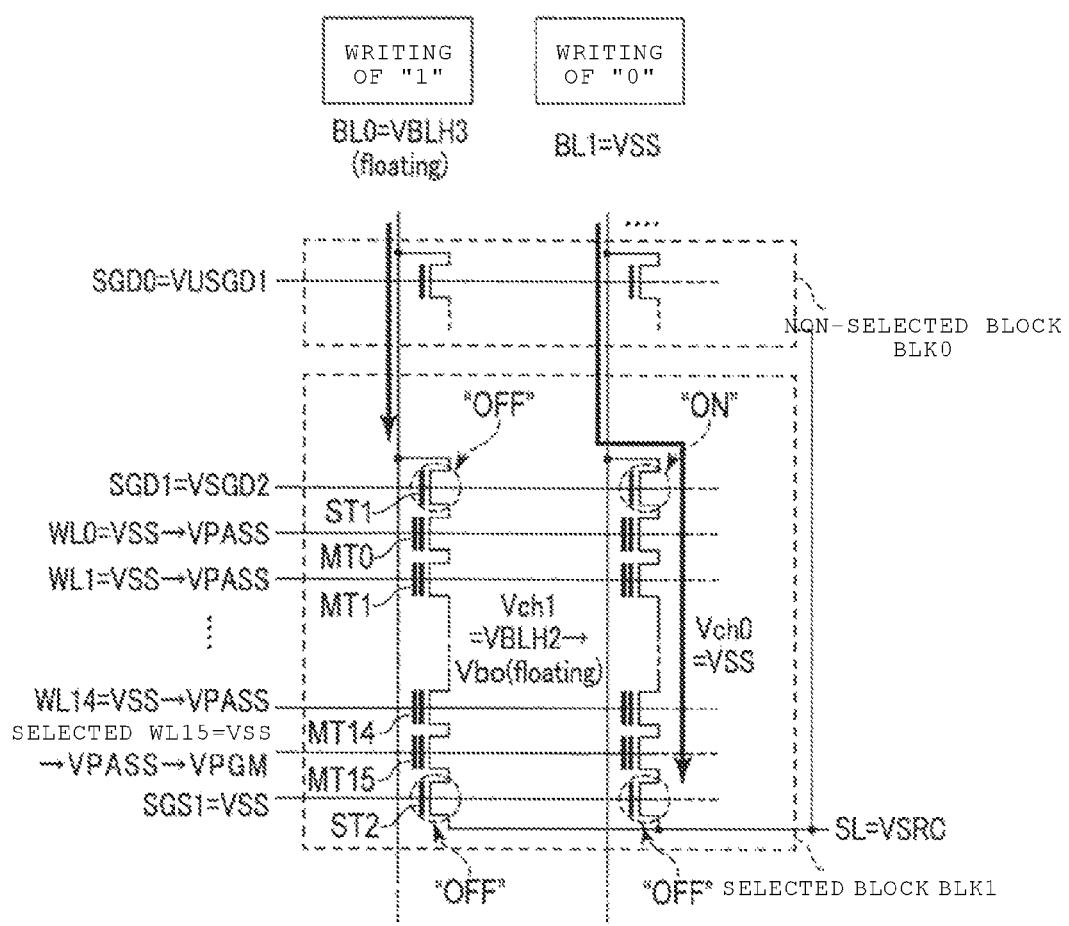

Next, at time t6, a third step is started. This state is illustrated in FIG. 11. That is, at time t6, the row decoder 112 applies a voltage VPASS (for example, 7 V) to a selected word line WL and a non-selected word line WL. The voltage VPASS prevents erroneous writing in a non-selected memory cell transistor MT during writing while setting a memory cell transistor MT to be in an on state, regardless of a threshold voltage of the memory cell transistor MT. Then, the channel potential Vch1 increases to a voltage Vbo by coupling with the word line WL.

Next, at time t7, the row decoder 112 applies a voltage VPGM (for example, 20V) to a selected word line WL. The voltage VPGM is a high positive voltage for injecting charge into a charge storage layer, and has a relation of VPGM>VPASS. Thereby, in a memory cell transistor MT, which is a target for writing of "0", connected to the selected word line WL, charge is injected into the charge storage layer. On the other hand, in a memory cell transistor MT, which is a target for writing of "1", connected to the selected word line WL, the channel potential Vch1 further increases by coupling with VPGM, and thus charge is not injected into the charge storage layer.

Thereafter, a recovery operation is performed between time t8 and time t9, and each conductive line is reset.

1.3 Effects According to this Embodiment

In the configuration according to this embodiment, it is possible to improve the reliability of a write operation. The effects will be described below.

During data writing, an "H"-level voltage is applied to a bit line BL ("1"). Thereby, the corresponding select transistor ST1 is set to be in a cut-off state, a channel potential of the NAND string 116 is set to be in a floating state. Accordingly, when VPGM is applied to a selected word line WL, a channel potential Vch1 of the NAND string 116 increases by capacitive coupling, and thus charge is not injected into a charge storage layer of a memory cell transistor MT. This is known as a self-boosting technique.

However, in recent mobile devices such as a mobile phone, a power supply voltage has become lower. The above-mentioned "H"-level voltage is generated by dropping a power supply voltage. For this reason, when the power supply voltage becomes lower, an "H"-level voltage also becomes lower. When the power supply voltage is 3.0 V, the voltage of an "H" level is set as, for example, approximately 2.5 V. On the other hand, in the case of a low voltage operation type NAND type flash memory 100 that operates at a power supply voltage of 1.8 V, the voltage of an "H" level is set as, for example, approximately 1.5 V.

In the self-boosting technique, a channel potential Vch1 increases up to a potential Vbo by coupling with a word line WL based on the above-mentioned potential of an "H" level. Accordingly, when the potential of an "H" level drops in association with a drop in the power supply voltage, a reference potential of channel boosting also drops, and thus there is a possibility that the potential Vbo also drops during writing. As a result, a potential difference between a control gate and a channel becomes larger, and thus there is a possibility of erroneous writing occurring. In addition, when an "H"-level voltage becomes lower, a voltage difference from a select gate line SGD is reduced. For this reason, a select transistor ST1 of the NAND string 116 corresponding to writing of "1" is set to be in an on state, and thus erroneous writing may occur.

In order to suppress the occurrence of erroneous writing, for example, a method of generating an "H"-level voltage higher than a power supply voltage using a charge pump is considered. However, when a page length for writing data is, for example, kilobytes, the bit line capacity thereof is set as approximately several hundreds of nF, and thus current consumption for boosting using a charge pump is also set as, for example, several tens of mA. Further, since it is necessary to newly provide a charge pump for supplying a voltage to a sense amplifier unit SAU, a chip area is increased to that extent.

On the other hand, in this embodiment, potentials of a bit line BL ("0"), a source line SL, and a select gate line SGD of a non-selected block BLK are increased, and a voltage ("H"-level voltage) of a bit line BL ("1") is made to be higher than a power supply voltage by capacitive coupling with the plurality of conductive lines. Further, thereafter, the boosted "H"-level voltage is trapped in a channel by controlling the voltage of the select gate line SGD. That is, when a channel potential is increased by coupling with a word line WL, it is possible to sufficiently increase the original voltage. Thereby, a channel potential Vch1 of the NAND string 116 corresponding to a bit line ("1") before VPASS and VPGM are applied to a word line WL may be made to be higher than a power supply voltage. As a result, it is possible to sufficiently increase the potential to Vbo by a self-boosting technique and to more reliably cut off a select transistor ST1 corresponding to a bit line BL ("1"). Accordingly, erroneous writing is suppressed, and thus it is possible to improve the reliability of a write operation.

Further, in this embodiment, potentials of a source line SL and a select gate line SGD of a non-selected block BLK are also increased, in addition to a potential of a bit line BL ("0"). Thereby, it is possible to increase a potential of a bit line BL ("1") regardless of a data pattern. For example, as a capacitive component of the bit line BL, an adjacent capacitance between bit lines BL is dominant, but a capacitance between the bit line and a source line SL and a capacitance between the bit line and a select gate line SGD of a non-selected block BLK account for approximately 10%. For example, when all bits of page data to be written are "1", an "H" level is applied to all of the bit lines BL. For this reason, the adjacent capacitance between the bit lines is not observed effectively, and a capacitance between the bit line and the source line SL and a capacitance between the bit line and the select gate line SGD of the non-selected block BLK become dominant. Accordingly, it is possible to secure a bit line boosting level that is not dependent upon a data pattern by using capacitive coupling with the source line SL or the select gate line SGD of the non-selected block BLK.

Further, since an "H"-level voltage may be boosted to a voltage higher than a power supply voltage without using a charge pump, it is thus possible to suppress an increase in current consumption and a chip area.

2. Second Embodiment

Next, a semiconductor memory device according to a second embodiment will be described. The present embodiment is obtained by applying the first embodiment to a three-dimensional stacked NAND type flash memory. Hereinafter, only differences from the first embodiment will be described.

2.1 Configuration of Memory Cell Array

Figure 12:
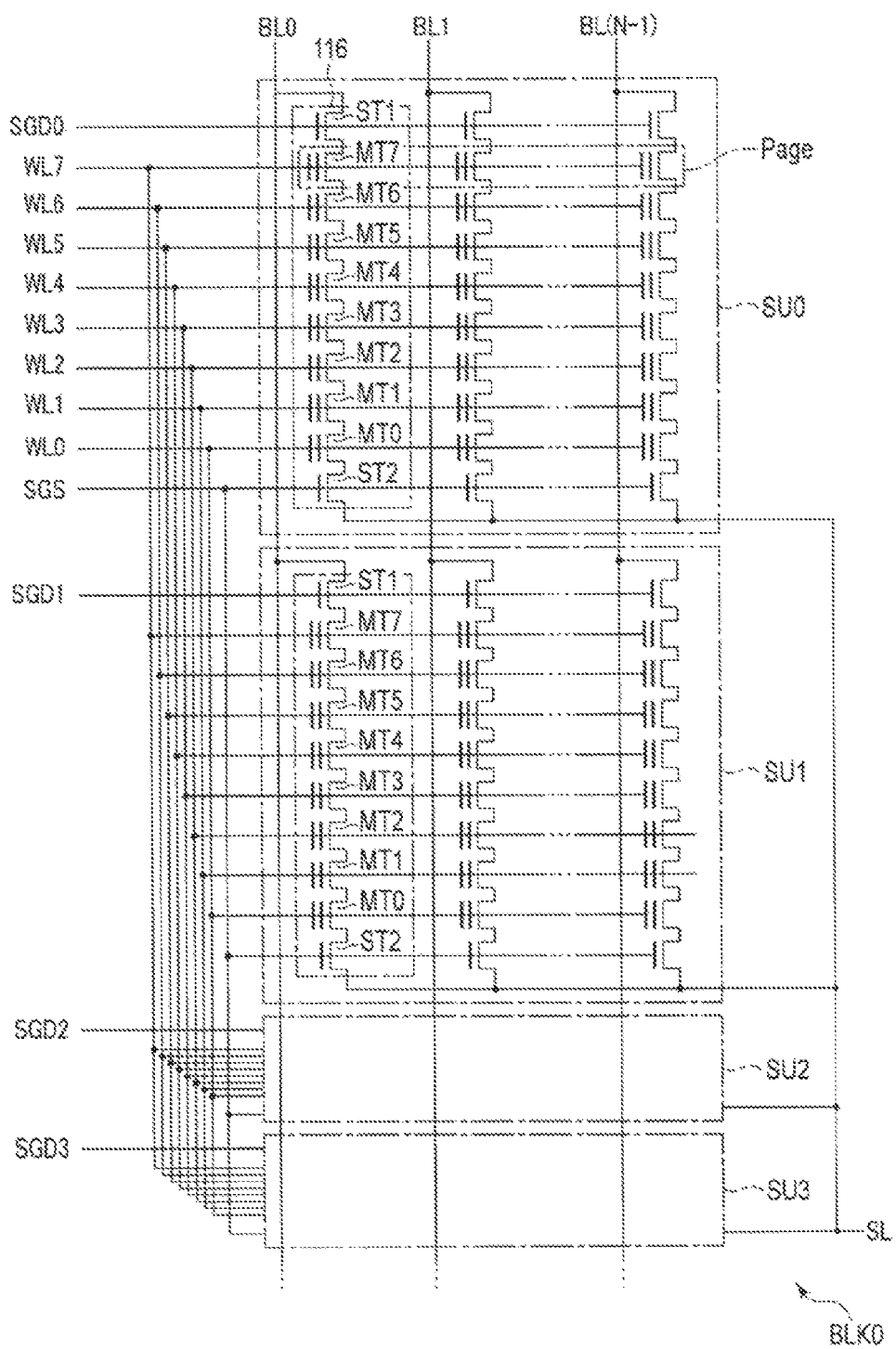
FIG. 12 is a circuit diagram of a memory cell array which is included in a semiconductor memory device according to a second embodiment.

First, the configuration of a memory cell array 111 according to this embodiment will be described with reference to FIG. 12. FIG. 12 is a circuit diagram of any one of blocks BLK within the memory cell array 111.

As illustrated in the drawing, each of blocks BLK according to this embodiment includes a plurality of (four in this example) string units SU (SU0 to SU3). Each of the string units SU is configured in the same manner as the block BLK described in the first embodiment with reference to FIG. 1. In other words, it may be said that one block BLK of the three-dimensional stacked NAND type flash memory is a set of a plurality of blocks BLK in a flat NAND type flash memory in which memory cell transistors MT are two-dimensionally arrayed. In addition, data writing and data reading are performed in page units in the same manner as a flat NAND type flash memory. In this embodiment, pieces of data are collectively written or read with respect to a plurality of memory cell transistors MT connected in common to any one of word lines WL in any string unit SU as a page. Meanwhile, unlike FIG. 1, in the example illustrated in FIG. 12, the number of memory cell transistors included in one NAND string 116 is eight, but is not of course limited to eight.

In each block BLK, word lines WL0 to WL7 and a select gate line SGS are connected in common to four string units SU0 to SU3. On the other hand, a select gate line SGD is independently provided for each string unit SU, gates of select transistors ST1 of the string units SU0 to SU3 are connected to select gate lines SGD0 to SGD3, respectively.

Next, a cross-sectional configuration of the memory cell array 111 according to this embodiment will be described with reference to FIG. 13.

As illustrated in the drawing, a plurality of NAND strings 116 are formed on a p-type well 22 formed in the surface of a semiconductor substrate. That is, a plurality of wiring layers 25 functioning as select gate lines SGS, a plurality of wiring layers 23 functioning as word lines WL, and a plurality of wiring layers 24 functioning as select gate lines SGD are formed on the p-type well 22.

A memory hole 26 of which the side surface comes into contact with the wiring layers 23 to 25 and of which the bottom reaches the p-type well 22 is formed. A block insulating film 27, a charge storage layer 28, and a tunnel insulating film 29 are sequentially formed on the side surface of the memory hole 26. Further, a semiconductor layer 30 is embedded in the memory hole 26. The semiconductor layer 30, functioning as a current path of the NAND string 116, is a region where a channel is formed during operation of memory cell transistors MT and select transistors ST1 and ST2.

In each NAND string 116, a plurality of (four in this example) wiring layers 25 are electrically connected in common to the same select gate line SGS. That is, the four wiring layers 25 actually function as gate electrodes of one select transistor ST2. The same is true of the wiring layers 24. Four wiring layers 24 are connected to the same select gate line SGD, and actually function as gate electrodes of one select transistor ST1. Meanwhile, the number of wiring layers 24 and the number of wiring layers 25 may be one or more, and are not limited thereto.

With the above-mentioned configuration, in each NAND string 116, the select transistor ST2, the plurality of memory cells transistor MT, and the select transistor ST1 are sequentially stacked on the p-type well 22.

Figure 13:
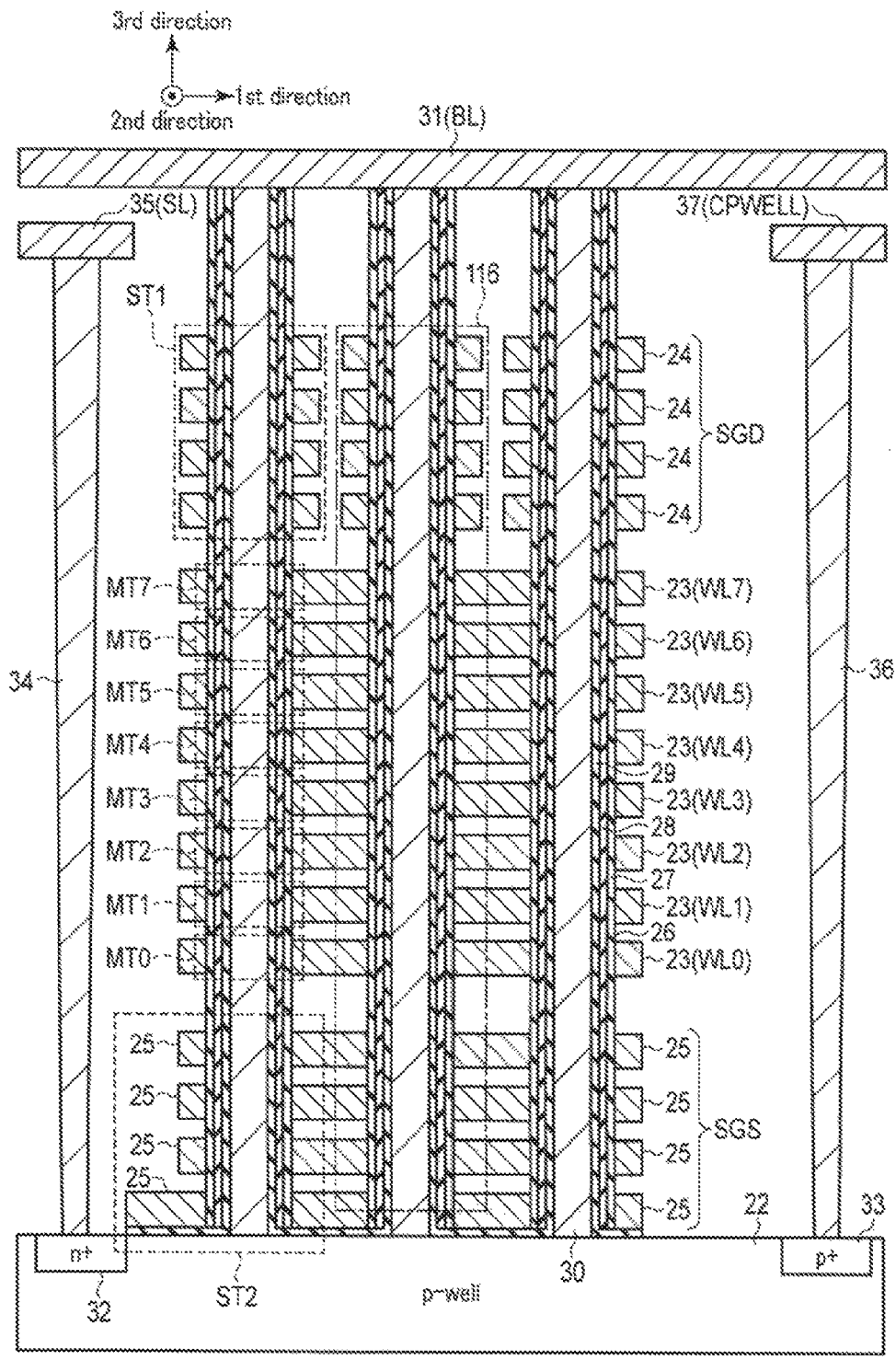
FIG. 13 is a cross-sectional view of the memory cell array of the semiconductor memory device according to the second embodiment.

Meanwhile, in the example of FIG. 13, the select transistors ST1 and ST2 include a charge storage layer 28 in the same manner as the memory cell transistor MT. However, the select transistors ST1 and ST2 do not function as memory cells that actually store data, and function as switches. A threshold voltage for turning on and turning off the select transistors ST1 and ST2 may be controlled by injecting charge into the charge storage layer 28.

A wiring layer 31 functioning as a bit line BL is formed on the memory hole 26, and is connected to the semiconductor layer 30.

Further, an n$^+$-type impurity diffusion layer 32 and a p$^+$-type impurity diffusion layer 33 are formed in the surface of the p-type well 22. A contact plug 34 is formed on the diffusion layer 32, and a wiring layer 35 functioning as a source line SL is formed on the contact plug 34. In addition, a contact plug 36 is formed on the diffusion layer 33, and a wiring layer 37 functioning as a well wiring CPWELL is formed on the contact plug 36. The wiring layers 35 and 37 are formed in layers which are located above the select gate line SGD and below the wiring layer 31.

The plurality of above-mentioned configurations are arrayed in the depth direction of the sheet of FIG. 13, and a string unit SU includes a sets of a plurality of NAND strings 116 lined up in the depth direction. In addition, the wiring layers 25 functioning as a plurality of select gate lines SGS included in the same string unit SU are connected in common to each other. The tunnel insulating film 29 is also formed on the p-type well 22 between the adjacent NAND strings 116, and the wiring layer 25 and the tunnel insulating film 29 which are adjacent to the diffusion layer 32 are formed up to the edge of the diffusion layer 32.

Accordingly, when charge is supplied to the semiconductor layer 30 from the diffusion layer 32, an n-channel is formed in the memory cell transistors MT and the select transistors ST1 and ST2, and the transistors operate as n-channel transistors.

Alternatively, the configuration of the memory cell array 111 may be as disclosed in, for example, U.S. patent application Ser. No. 12/407,403, filed on Mar. 19, 2009, which is entitled "THREE-DIMENSIONAL STACKED NONVOLATILE SEMICONDUCTOR MEMORY," U.S. patent application Ser. No. 12/406,524, filed on Mar. 18, 2009, which is entitled "THREE-DIMENSIONAL STACKED NONVOLATILE SEMICONDUCTOR MEMORY," U.S. patent application Ser. No. 12/679,991, filed on Mar. 25, 2010, which is entitled "NONVOLATILE SEMICONDUCTOR MEMORY DEVICE AND MANUFACTURING METHOD THEREOF," and U.S. patent application Ser. No. 12/532,030, filed on Mar. 23, 2009, which is entitled "SEMICONDUCTOR MEMORY AND MANUFACTURING METHOD THEREOF." The entire contents of these patent applications are incorporated by reference herein.

2.2 Write Operation

Next, a write operation in this embodiment will be described with reference to FIG. 14A. The write operation of this embodiment is substantially the same as FIGS. 5 to 11 described in the first embodiment. However, this embodiment is different from the first embodiment in that a voltage of a well wiring CPWELL also contributes to the boosting of a bit line BL ("1") in a second step.

As illustrated in the drawing, the driver 124 applies VSRC (for example, 1.5 V) to the well wiring CPWELL between time t3 and time t9.

As a result, at time t3, a potential of a bit line BL ("1") increases not only by influence from a bit line BL ("0"), a source line SL, and a select gate line SGD of a non-selected block BLK but also by capacitive coupling with the well wiring CPWELL, and is set to VBLH2 (for example, 2.5 V). For this reason, a channel potential Vch0 is also set to VBLH2.

Meanwhile, VSS is applied to select gate lines SGD and SGS of a non-selected string unit SU in a selected block BLK between time t1 and time t9.

Figure 14A:
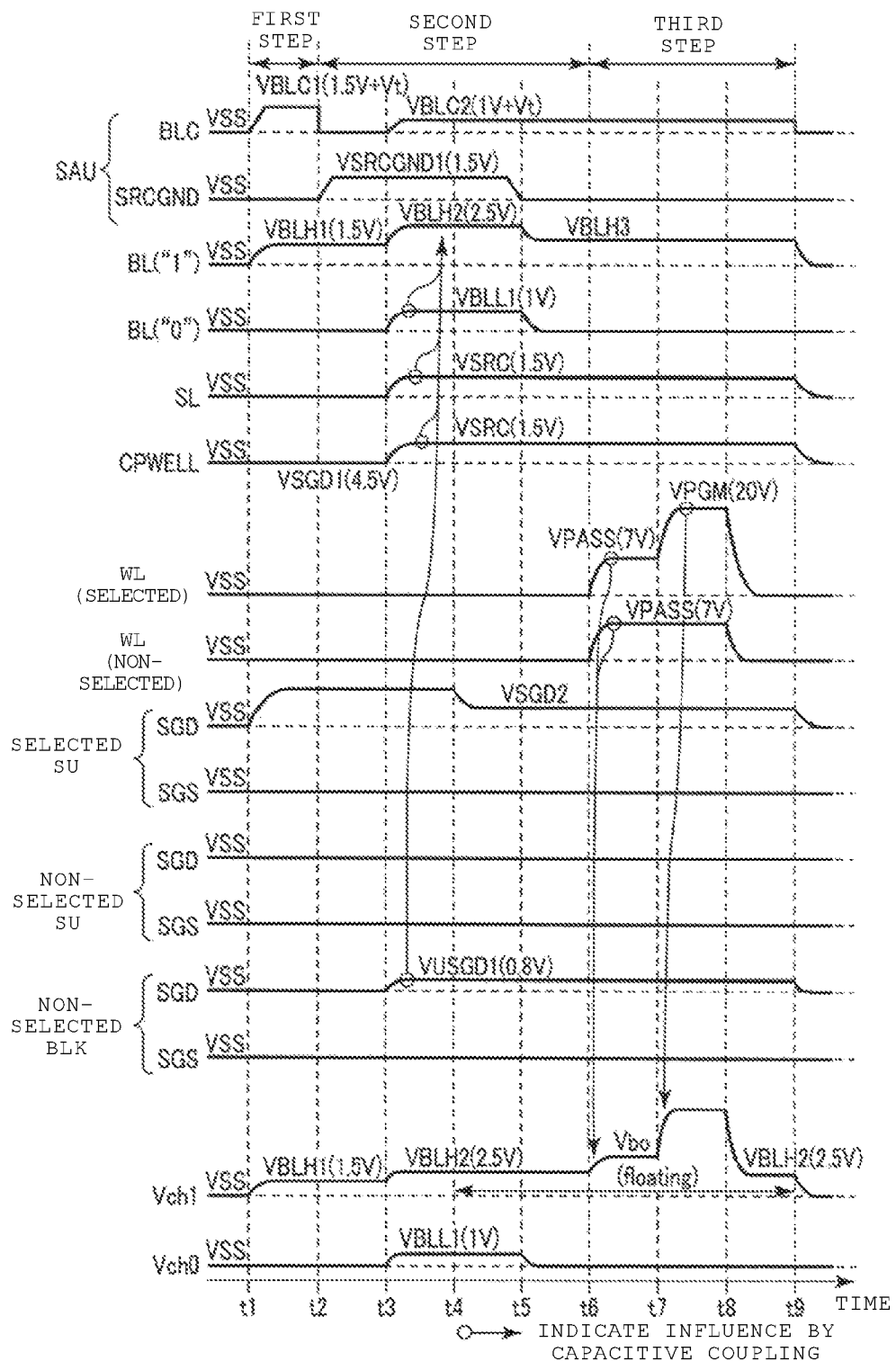
FIG. 14A and FIG. 14B are timing diagrams illustrating a potential of various lines during writing of the semiconductor memory device according to the second embodiment.
Figure 14B:
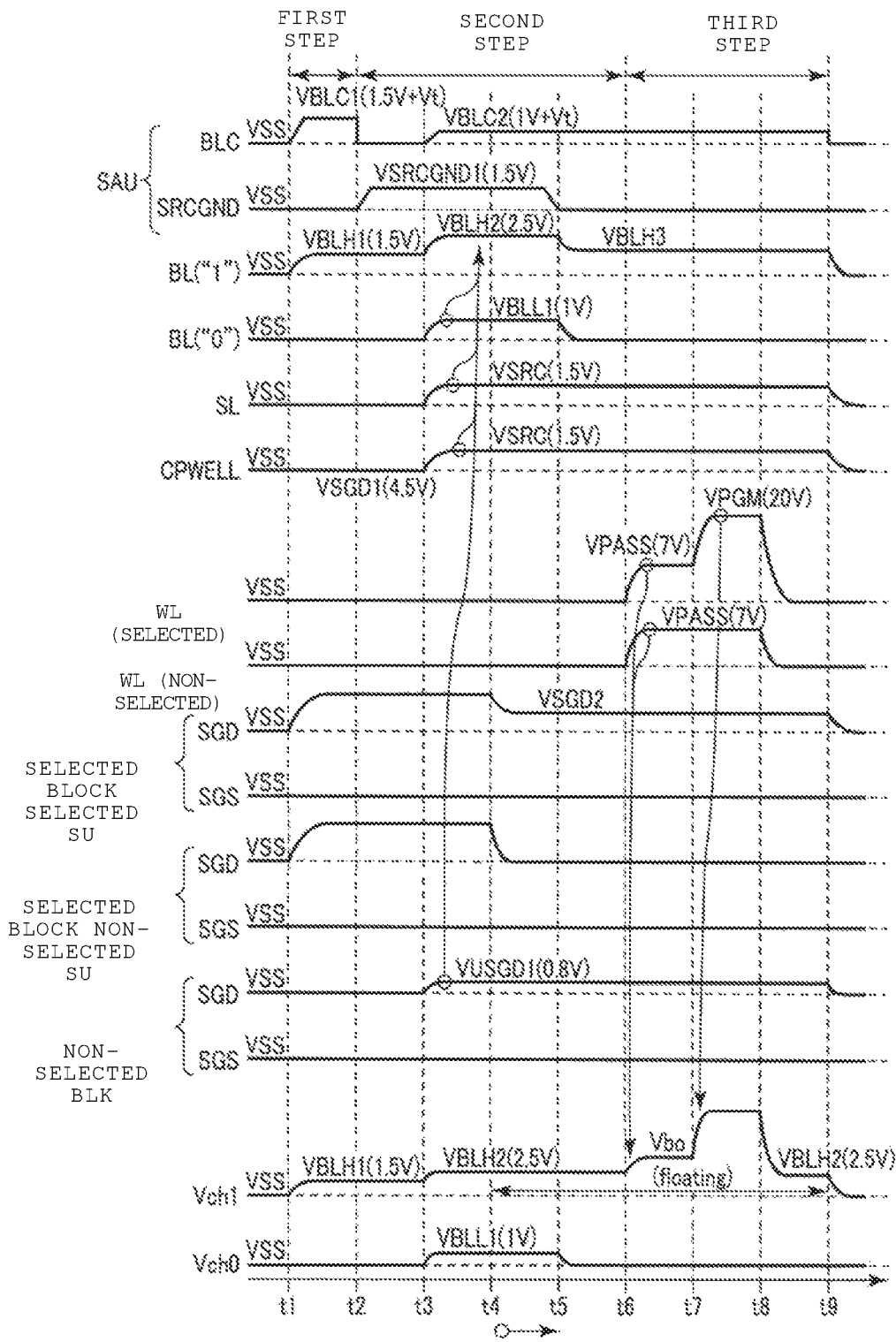

According to FIG. 14B, VSGD may be applied to select gate lines SGD of a non-selected string unit SU in a selected block BLK between t1 to t4. VSS may be applied to select gate lines SGS of a non-selected string unit SU in a selected block BLK between time t1 and time t4.

2.3 Effects According to this Embodiment

According to the configuration according to this embodiment, the same effects as those in the first embodiment mentioned above are obtained even in a three-dimensional stacked NAND type flash memory.

In addition, in the configuration according to this embodiment, a potential of a bit line BL ("1") is increased not only using influence from a bit line BL ("0"), a source line SL, and a select gate line SGD of a non-selected block BLK but also using capacitive coupling with a well wiring CPWELL. Naturally, also in this embodiment, the bit line BL ("1") may be increased by influence from a bit line BL ("0"), a source line SL, and a select gate line SGD of a non-selected block BLK without using the well wiring CPWELL, in the same manner as in the first embodiment. However, it is possible to increase the potential of the bit line BL ("1") at a higher speed and up to a more sufficient potential by using the well wiring CPWELL together 3. Third Embodiment Next, a semiconductor memory device according to a third embodiment will be described. In this embodiment, the writing of data "0" in the first and second embodiments is performed by combining a plurality of writing conditions having different variations in a threshold voltage. Hereinafter, only differences from the first and second embodiments will be described.

3.1 Write Operation

First, a write operation in this embodiment will be broadly described. The write operation according to this embodiment includes a first write operation and a second write operation. Each write operation includes a programming operation of increasing a threshold voltage by injecting electrons into a charge storage layer and a verifying operation of determining whether or not the threshold voltage reaches a target value as a result of the programming operation.

A sequencer 121 performs a first write operation before a threshold voltage of a memory cell transistor reaches a first verification level VL1 after a write operation is started. In the first write operation, data is programmed (hereinafter, referred to as a "first programming operation") using a writing condition having a relatively large variation in threshold voltage (hereinafter, referred to as a "first condition").

When the threshold voltage of the memory cell transistor reaches the first verification level VL1, the sequencer 121 performs a second write operation. In the second write operation, data is programmed (hereinafter, referred to as a "second programming operation") under a condition having a smaller variation in threshold voltage than that of the first programming (referred to as a "second condition"). In addition, in the second writing, a second verification level VL2 higher than the first verification level is used.

Figure 15A:
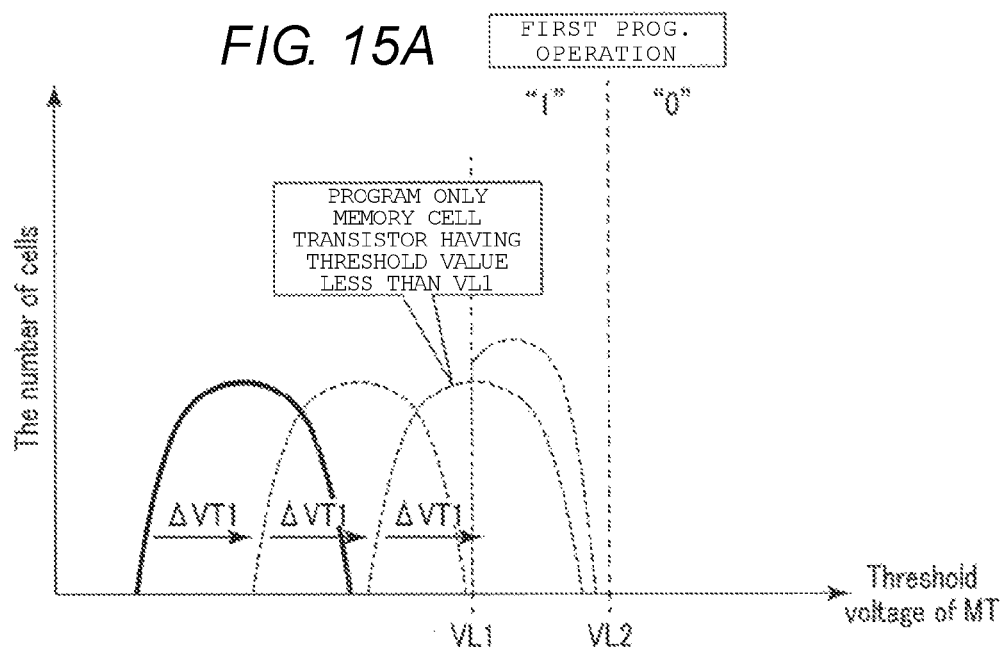
FIG. 15A and FIG. 15B are diagrams illustrating a threshold voltage of a memory cell transistor during first and second programming operations of a semiconductor memory device according to a third embodiment.

Next, a manner in which a threshold voltage varies through the first and second write operations will be described with reference to FIGS. 15A and 15B. FIG. 15A shows the first programming operation, and FIG. 15B shows the second programming operation.

In the example on FIG. 15A, the sequencer 121 performs a first programming operation three times. Specifically, for the first and second program steps, the sequencer 121 performs a first programming operation on all memory cell transistors MT because threshold voltages of all of the memory cell transistors MT are less than the first verification level VL1. For a third program step, the first programming operation is performed on the memory cell transistor MT having a threshold voltage less than the first verification level VL1, and a second programming operation is performed on the memory cell transistor MT having a threshold voltage equal to or greater than the first verification level VL1 and less than the second verification level VL2.

In other words, the first programming operation and the second programming operation are simultaneously performed within one page which is a target for writing. Specifically, a sense amplifier 113 applies, for example, VSS to a bit line BL corresponding to a memory cell transistor MT having a threshold voltage less than the first verification level VL1, and applies a voltage higher than VSS to a bit line BL corresponding to a memory cell transistor MT having a threshold voltage equal to or greater than the first verification level VL1 and less than the second verification level VL2. As a result of the third program step, it is assumed that threshold voltages of all of the memory cell transistors MT will be equal to or greater than the first verification level VL1.

Figure 15B:
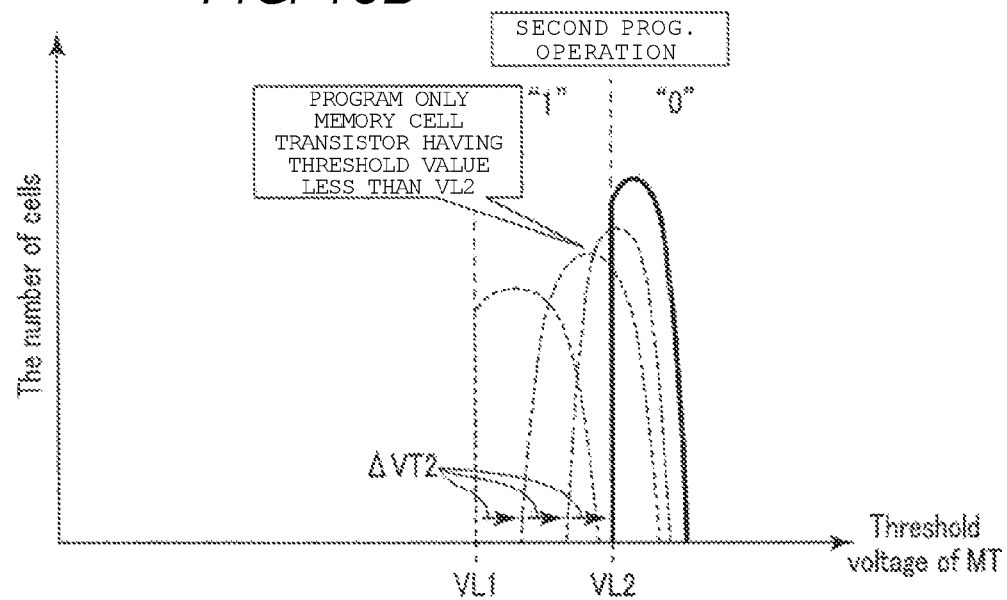

FIG. 15B shows a state of a variation in threshold voltage through a fourth program step and the subsequent program steps. As illustrated in the drawing, it is assumed that threshold voltages of some memory cell transistors MT are equal to or greater than the second verification level VL2 through the fourth program step.

For a fifth program step, the second programming step is continuously performed on a memory cell transistor MT having a threshold voltage less than the second verification level VL2. On the other hand, a non-writing voltage is applied to a bit line BL corresponding to a memory cell transistor MT having a threshold voltage equal to or greater than the second verification level VL2, and thus programming on the memory cell transistor MT is prohibited. The same is true for a sixth program step. As a result of the sixth program step, when threshold voltages of all memory cell transistors MT which are targets for writing are equal to or greater than the second verification level VL2, writing from a level "1" to a level "0" is completed. Meanwhile, when a variation in threshold voltage through writing using a first condition is set to ΔVT1 and a variation in threshold voltage through writing using a second condition is set to ΔVT2, ΔVT1 and ΔVT2 has a relation of ΔVT1>ΔVT2.

In this manner, in the write operation in this embodiment, when a current threshold voltage of a memory cell transistor MT which is a target for writing greatly deviates from a target threshold level, programming is performed using a condition having a large (rough) variation in threshold voltage. The current threshold voltage of the memory cell transistor MT approaches the target threshold voltage, programming is performed using a condition having a small (fine) variation in threshold voltage.

3.2 Details of Write Operation

Next, a write operation in this embodiment will be described in detail with reference to FIG. 16. FIG. 16 corresponds to the flow chart of FIG. 5 described in the first embodiment, and only differences from FIG. 5 will be described below. Meanwhile, in the following description, a bit line BL corresponding to a memory cell transistor having data "0" written therein and a channel potential of the NAND string 116 thereof are written as BL ("0") and Vch0, respectively, during the first write operation, and are written as BL ("QPW") and Vch_QPW, respectively, during the second write operation. Regarding the writing of "1", the bit line and the channel potential are written as BL ("1") and Vch1, respectively, during any operation.

As illustrated in FIG. 16, a write operation includes first to third steps in the same manner as in the first embodiment.

First Step

The first step is the same as that in the first embodiment. Similarly to BL ("0"), VSS (for example, 0 V) is applied to BL ("QPW") from the sense amplifier 113 (step S1-1'), and Vch_QPW is also set to VSS (step S1-2').

Second Step

The second step is also the same as that in the first embodiment. Similarly to BL ("0"), a positive voltage VBLL1 is applied to BL ("QPW") from the sense amplifier 113 (step S2-1'), and Vch_QPW is also set to VBLL1 (step S2-2').

Regarding Third Step

Unlike the first embodiment, in the third step, the sense amplifier 113 applies a positive voltage VBLL2 (for example, 0.5 V, VSS<VBLL2<VSGD2) to a bit line BL ("QPW") (step S3-1'). As a result, Vch_QPW is also set as VBLL2. Data is programmed in this state (step S3-2).

Figure 17:
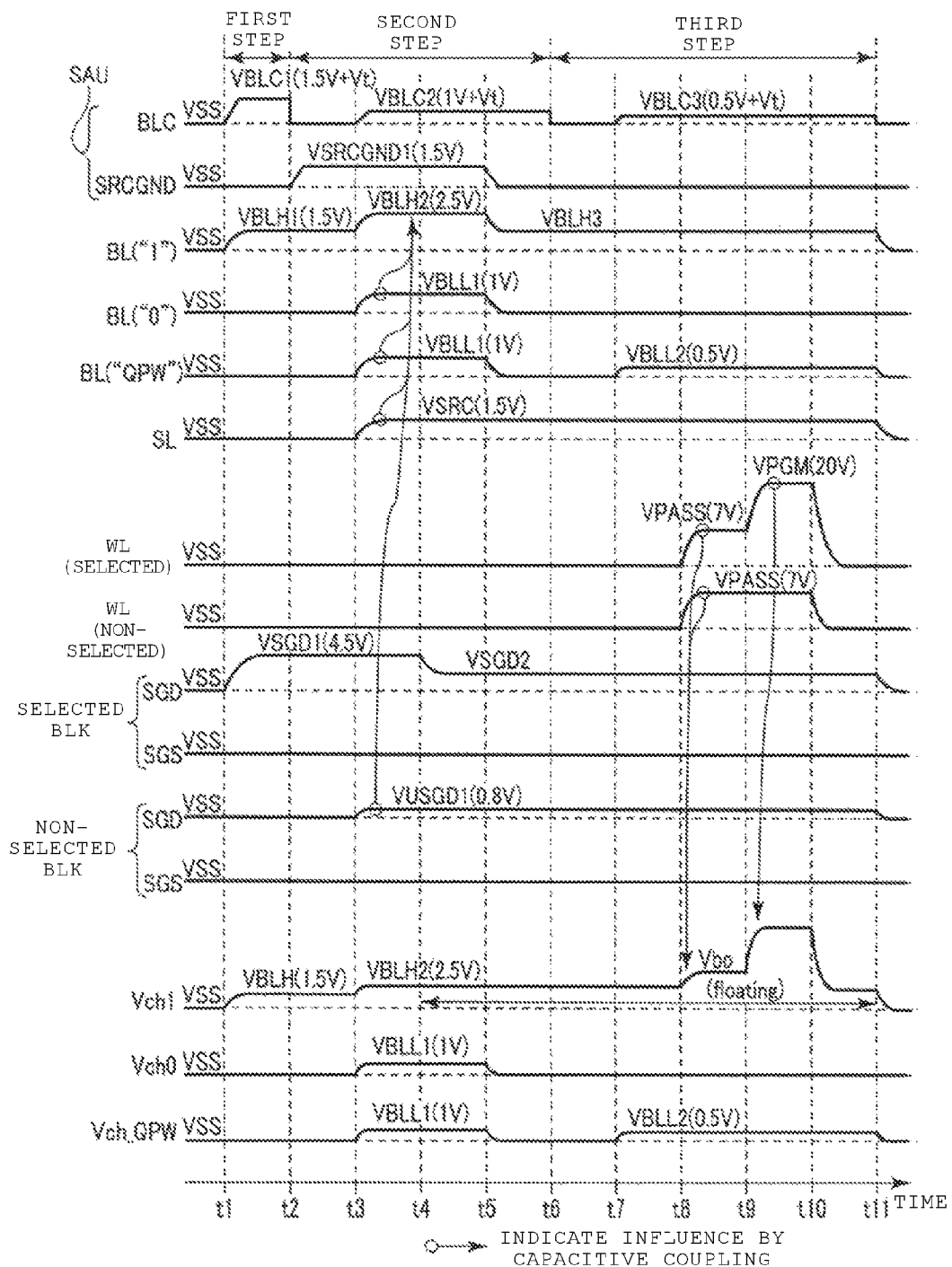
FIG. 17 is a timing diagram illustrating a potential of various lines during writing of the semiconductor memory device according to the third embodiment.

Next, the above-mentioned variations in the voltage of each conductive line during a data write operation will be described with reference to FIG. 17. FIG. 17 corresponds to FIG. 6 in the first embodiment, and a description will be given below focusing on only differences from the first embodiment.

First and Second Steps

A potential of a bit line BL ("QPW") and a channel potential Vch_QPW in the first and second steps (times t1 to t6) are the same as a potential of a bit line BL ("0") and a channel potential Vch0. This is the same as that in the first embodiment, and thus a description thereof will be omitted here.

Third Step

In the third step, first, data stored in a latch circuit 210 of a sense amplifier unit SAU that performs the second programming operation is inverted at time t6. Specifically, the sequencer 121 sets a voltage of a signal BLC as VSS and sets a transistor 41 to be in an off state. The sequencer 121 gives an "H" level (data "1") to a node LAT of the latch circuit 210, and gives an "L" level (data "0") to a node INV. Thereby, in the sense amplifier unit SAU described in FIG. 5, a first switch is set to be in an on state, and a second switch is set to be in an off state. Accordingly, at time t6 and the subsequent times, a positive voltage obtained by clamping VDDSA by the transistor 41 is applied to the bit line BL ("QPW"), in the same manner as the bit line BL ("1").

Next, at time t7, the sequencer 121 sets a voltage of the signal BLC as VBLC3 (for example, 0.5 V+Vt, VBLC3<VBLC2). Thereby, the sense amplifier unit SAU performing the second programming operation applies a voltage VBLL2 (for example, 0.5 V) to the bit line BL ("QPW"). At this time, the voltage VBLL2 is set to be higher than a voltage VSS of the bit line BL ("0"), and is set to be lower than a voltage VSGD2–Vt so that a select transistor ST1 is set to be in an on state. Since the select transistor ST1 is set to be in an on state, a channel potential Vch_QPW is set to VBLL2 transmitted from the bit line BL ("QPW"). In addition, in a sense amplifier unit SAU that writes "1", a potential VBLH3 of the bit line BL ("1") is higher than VBLC3, and thus the transistor 41 is set to be in a cut-off state.

Next, as described in times t6 to t8 of FIG. 6, the row decoder 112 applies VPASS to a non-selected word line WL and sequentially applies VPASS and VPGM to a selected word line WL between time t8 and time t10. Thereby, in a memory cell transistor MT which is a target for the first and second programming operations, charge is injected into a charge storage layer. At this time, the channel potential Vch_QPW is higher than the channel potential Vch0. For this reason, in the second programming operation, the amount of charge injected into the charge storage layer is smaller than that in the first programming operation, and thus a variation in threshold voltage is reduced.

Next, a recovery operation is performed between time t10 and time t11, and writing is terminated.

3.3 Effects According to this Embodiment

In the configuration according to this embodiment, the same effects as in the first and second embodiments mentioned above are obtained.

Further, in the configuration according to this embodiment, when a threshold voltage of a memory cell transistor MT greatly deviates from a target level, the first programming operation is performed to increase a variation in threshold voltage. Thereby, it is possible to reduce the number of programming loops. Accordingly, it is possible to improve a processing speed during writing.

Further, when a threshold voltage of a memory cell transistor MT is close to a target level, the second programming operation is performed to reduce a variation in threshold voltage. In this manner, it is possible to finely control a threshold voltage by changing a variation in threshold voltage, and thus writing may be performed so as to reduce a distribution width of the threshold voltage. Accordingly, it is possible to improve reliability during writing.

In addition, the third embodiment may also be applied to the second embodiment. Further, in this embodiment, a case where data is written by write operations (first and second write operations) using two writing conditions has been described as an example, but three or more writing conditions may be used.

4. Fourth Embodiment

Next, a semiconductor memory device according to a fourth embodiment will be described. This embodiment is configured such that potentials of channels of all NAND strings 116 of a selected block BLK increase by capacitive coupling at the initial stage of writing in the second embodiment.

Hereinafter, only differences from the second embodiment will be described.

4.1 Write Operation According to this Embodiment

Figure 18:
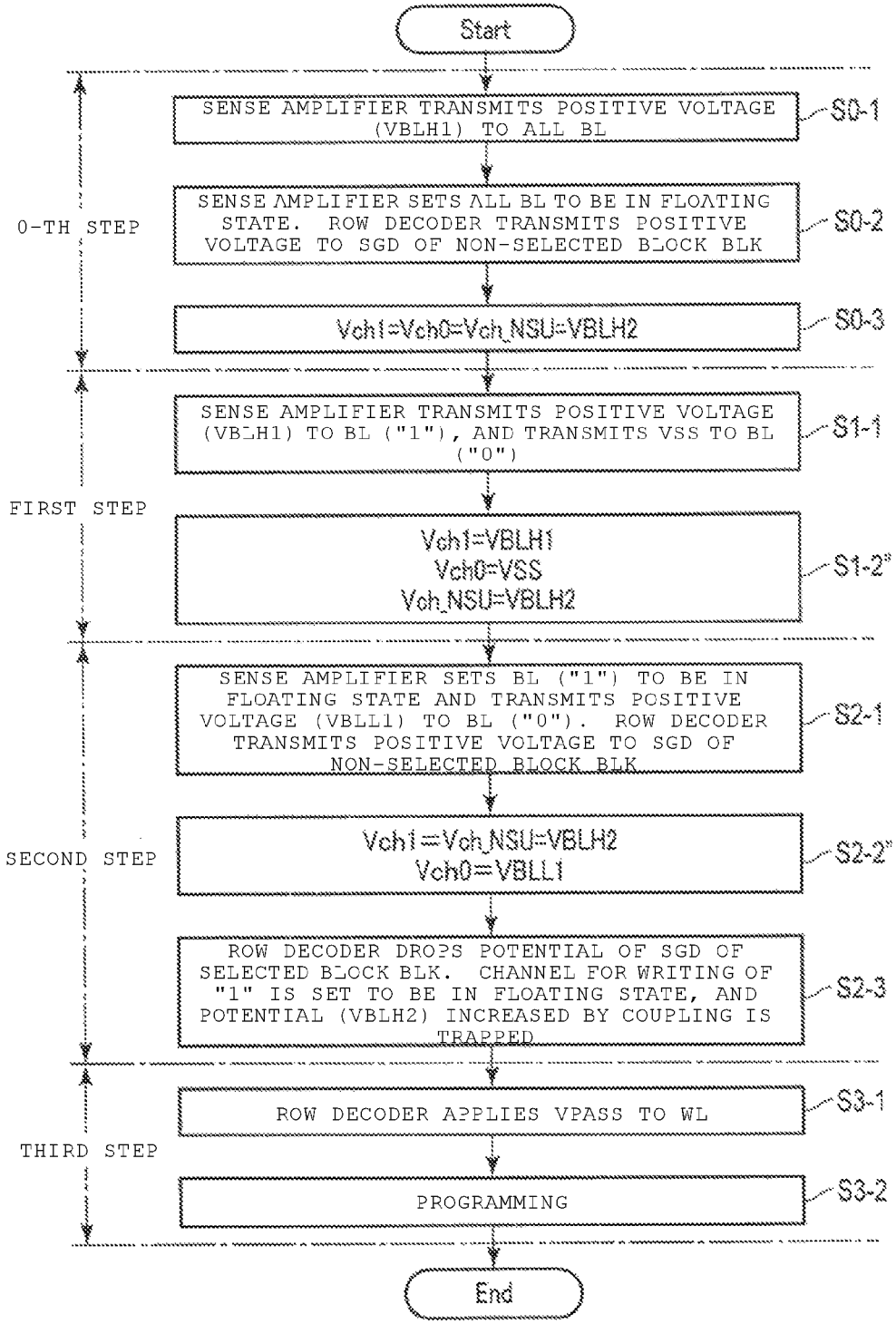
FIG. 18 is a flow diagram of a write operation of a semiconductor memory device according to a fourth embodiment.

First, a concept of a write operation will be described with reference to FIG. 18. FIG. 18 corresponds to FIG. 5 described in the first embodiment, and a description will be given below focusing on only differences from the first and second embodiments. Hereinafter, a channel potential of a NAND string 116 of a non-selected string unit SU of a selected block BLK will be referred to as Vch_NSU.

0-th Step

In this embodiment, a 0-th step is performed before a first step. In the 0-th step, first, a sense amplifier 113 transmits a positive voltage VBLH1 to channels of all NAND strings 116 of a selected block BLK through all bit lines BL. That is, in a state where select transistors ST1 of all string units SU of a selected block BLK are set to be turned on, the sense amplifier 113 applies the positive voltage VBLH1 to all bit lines BL (step S0-1).

In a state where all of the bit lines BL are electrically disconnected from the sense amplifier 113, a potential of a select gate line SGD of a non-selected block BLK increases to VUSGD1 (step S0-2).

As a result, potentials of all bit lines increase to VBLH2 by capacitive coupling with a select gate line SGD of a non-selected block BLK. All of channel potentials Vch0, Vch1, and Vch_NSU of a selected block BLK increase to VBLH2 (step S0-3).

First to Third Steps

Figure 5:
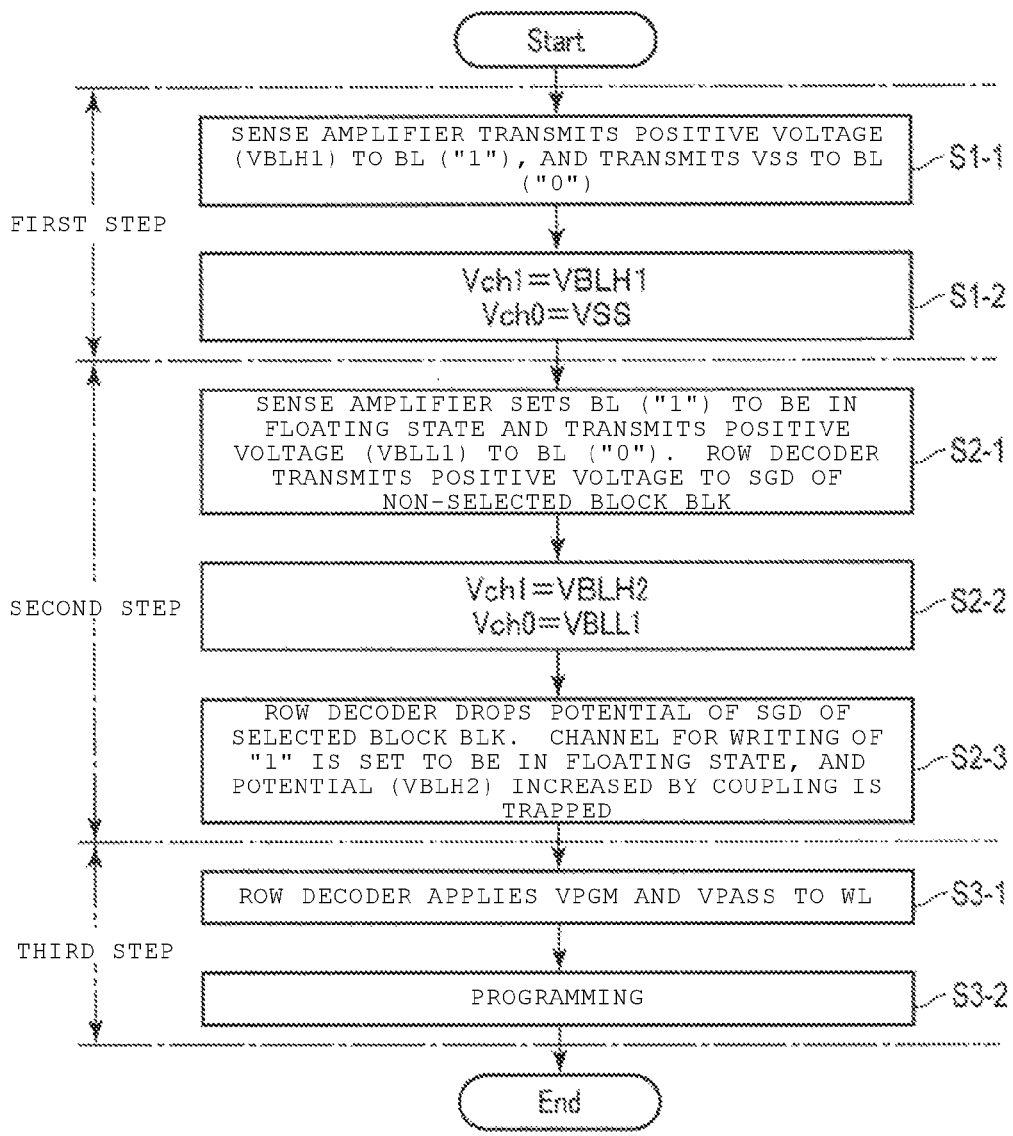
FIG. 5 is a flow diagram of a write operation of the semiconductor memory device according to the first embodiment.

Operations in first to third steps are substantially the same as those in FIG. 5. The difference is in that a channel potential Vch_NSU boosted by capacitive coupling is maintained to be VBLH2 because a channel of a non-selected SU of a selected block BLK is set to be in a floating state in the first to third steps.

4.2 Details of Write Operation

Figure 19:
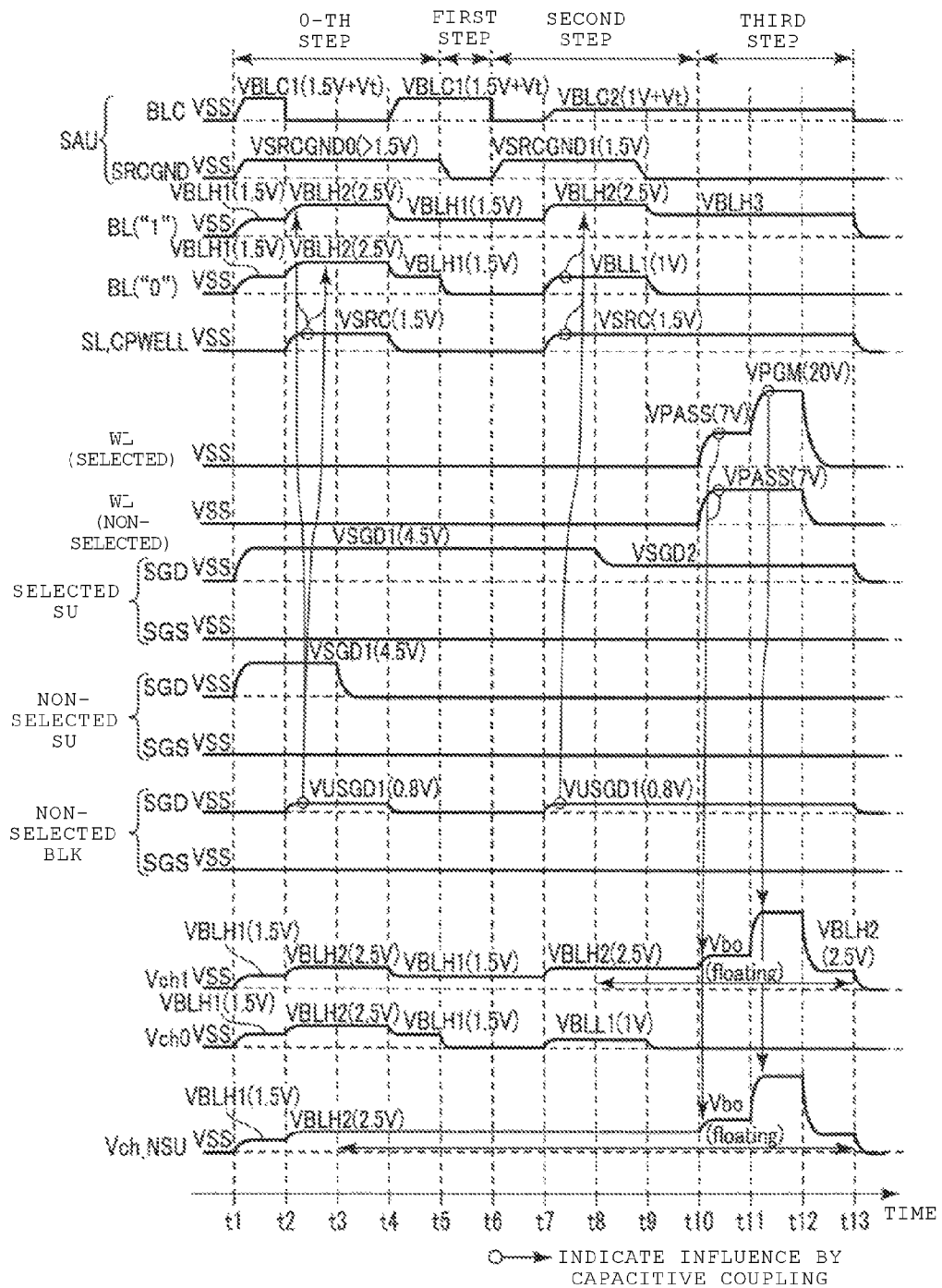
FIG. 19 is a timing diagram illustrating a potential of various lines during writing of the semiconductor memory device according to the fourth embodiment.

Next, a change in a voltage of each conductive line during writing in this embodiment will be described with reference to FIG. 19. FIG. 19 corresponds to FIG. 14A described in the second embodiment, and a description will be given below focusing on only differences from the second embodiment.

0-th Step

As illustrated in the drawing, a 0-th step is performed between time t1 and time t5. First, at time t1, the sequencer 121 sets a voltage of a signal BLC to VBLC1 (for example, 1.5 V+Vt). In addition, a voltage VSRCGND0 (>1.5 V) is applied to a node SRCGND. The voltage VSRCGND0 is higher than VBLC1–Vt, and may have the same potential as, for example, VDDSA.

Thereby, a sense amplifier unit SAU applies a voltage VBLH1 (1.5 V) clamped by a transistor 41 is applied to all bit lines BL.

A row decoder 112 applies a voltage VSGD1 (for example, 4.5 V) to all select gate lines SGD of a selected block BLK. On the other hand, the row decoder 112 applies VSS of a select gate line SGD of a non-selected block BLK. Thereby, all select transistors ST1 within the selected and non-selected string units of the selected block BLK are set to be in an on state. As a result, channel potentials Vch0 and Vch1 of a selected string unit SU and a channel potential Vch_NSU of a non-selected string unit SU are set to VBLH1 (1.5 V).

Next, at time t2, the sequencer 121 sets a voltage of a signal BLC as VSS. Thereby, the transistor 41 is set to be in an off state, and all bit lines BL are set to be in a floating state.

A driver 124 applies a voltage VSRC (for example, 1.5 V) to a source line SL. In addition, the row decoder 112 applies a voltage VUSGD1 (for example, 0.8 V) to a select gate line SGD of a non-selected block BLK.

Thereby, potentials of all bit lines BL increase to a voltage VBLH2 (for example, 2.5 V) by capacitive coupling with the potential VSRC (1.5 V) of the source line SL and the potential VUSGD1 (0.8 V) of the select gate line SGD of the non-selected block BLK. Since a select transistor ST1 is set to be in an on state, channel potentials Vch0, Vch1, and Vch_NSU of a selected block BLK are set as VBLH2 in the same manner as the bit line BL.

Next, at time t3, the row decoder 112 applies VSS to a select gate line SGD corresponding to a non-selected string unit SU of a selected block BLK, and sets the select transistor ST1 to be in an off state. Thereby, a NAND string 116 of the non-selected string unit SU is set to be in a floating state.

Next, at time t4, the sequencer 121 sets a voltage of a signal BLC to VBLC1 (for example, 1.5 V+Vt).

In addition, the driver 124 applies a voltage VSS to the source line SL. Further, the row decoder 112 applies a voltage VSS to the select gate line SGD of the non-selected block BLK. Then, potentials of all bit lines BL are set as VBLH1 (for example, 1.5 V) by the influence of capacitive coupling.

At this time, since the select transistor ST1 is set to be in an on state, channel potentials Vch0 and Vch1 of the selected string unit SU in the selected block BLK are set as VBLH1 (for example, 1.5 V) which is the same as that of the bit line BL. On the other hand, since the select transistor ST1 is set to be in an off state, a channel potential Vch_NSU of the non-selected string unit SU in the selected block BLK is maintained to be VBLH2 (for example, 2.5 V).

First to Third Steps

The first to third steps are substantially the same as those in FIG. 14A described in the second embodiment. Here, the channel potential Vch_NSU of the non-selected string unit SU in the selected block BLK are maintained to be in a floating state between time t3 and time t13. Accordingly, the channel potential Vch_NSU is maintained to be VBLH2 (for example, 2.5 V) during the first to third steps, and increases to Vbo by channel boosting between time t10 and time t11.

4.2 Effects According to this Embodiment

In the configuration according to this embodiment, the same effects as those in the second embodiment are obtained.

In addition, in this embodiment, the channel potential Vch_NSU of the non-selected string unit SU is set to be higher than a voltage supplied from the sense amplifier unit SAU, in the same manner as the channel potential Vch1. Thereby, it is possible to suppress erroneous writing in a memory cell transistor MT within the non-selected string unit SU. Accordingly, it is possible to improve the reliability of a write operation.

Meanwhile, in this example, a description is given of an example in which the channel potential Vch_NSU and the channel potential Vch1 are equal to each other (VBLH2) when VPASS and VPGM are applied to a selected word line, but these channel potentials may be different from each other. That is, a potential which is charged in a channel of a NAND string 116 of a non-selected string unit SU at time t2 may be different from a potential charged in a channel of a NAND string 116 of a selected string unit SU which is a target for writing of "1" at time t7, or both of the potentials may be higher than VSS.

Further, a voltage of the source line SL which is applied at time t2 may be different from a voltage of the source line SL which is applied at time t7. Similarly, a voltage of the select gate line SGD of the non-selected block BLK which is applied at time t2 may be different from a voltage of the select gate line SGD of the non-selected block BLK at time t7. It is possible to appropriately set which values the voltages are set as, in consideration of the influence of capacitive coupling.

5. Modification Example and the Like

The semiconductor memory device according to the above-mentioned embodiment includes a first block BLK (block BLK0 of FIG. 1) including a first NAND string 116 (NAND string 116 of the block BLK0 of FIG. 1) that includes a first memory cell transistor MT (memory cell transistor MT0 of the block BLK0 of FIG. 1) and a first select transistor ST1 (select transistor ST1 of the block BLK0 of FIG. 1), a second block BLK (block BLK1 of FIG. 1) including a second NAND string 116 (NAND string 116 of the block BLK1 of FIG. 1) that includes a second memory cell transistor MT (memory cell transistor MT0, not shown in the drawing, of the block BLK1 of FIG. 1) and a second select transistor ST1 (select transistor ST1, not shown in the drawing, of the block BLK1 of FIG. 1), first and second select gate lines (select gate lines SGD0 and SGD1 of FIG. 1), a first bit line BL (bit line BL0 of FIG. 1), and a first sense amplifier unit SAU (sense amplifier unit SAU of FIG. 1). A first select gate line SGD is connected to the first select transistor ST1. A second select gate line SGD is connected to the second select transistor ST1. The first and second NAND strings 116 are connected in common to the first bit line BL. The first bit line BL is connected to the first sense amplifier unit SAU. During the writing of data in the first memory cell transistor MT, a first voltage (VSGD1 of FIG. 6) for setting the first select transistor ST1 to be in an on state is applied to the first select gate line SGD and a voltage of the second select gate line SGD increases to a second voltage (VUSGD1 of FIG. 6) in a state where the first sense amplifier unit SAU and the first bit line BL are electrically disconnected from each other. After the voltage of the second select gate line SGD increases to the second voltage (VUSGD1 of FIG. 6), a third voltage (VSGD2 of FIG. 6) which is lower than the first voltage is applied to the first select gate line SGD.

It is possible to provide a semiconductor memory device capable of improving the reliability of a write operation by applying the above-mentioned embodiment. Meanwhile, the embodiment is not limited to the above-mentioned mode, and may be modified in various ways.

Figure 20:
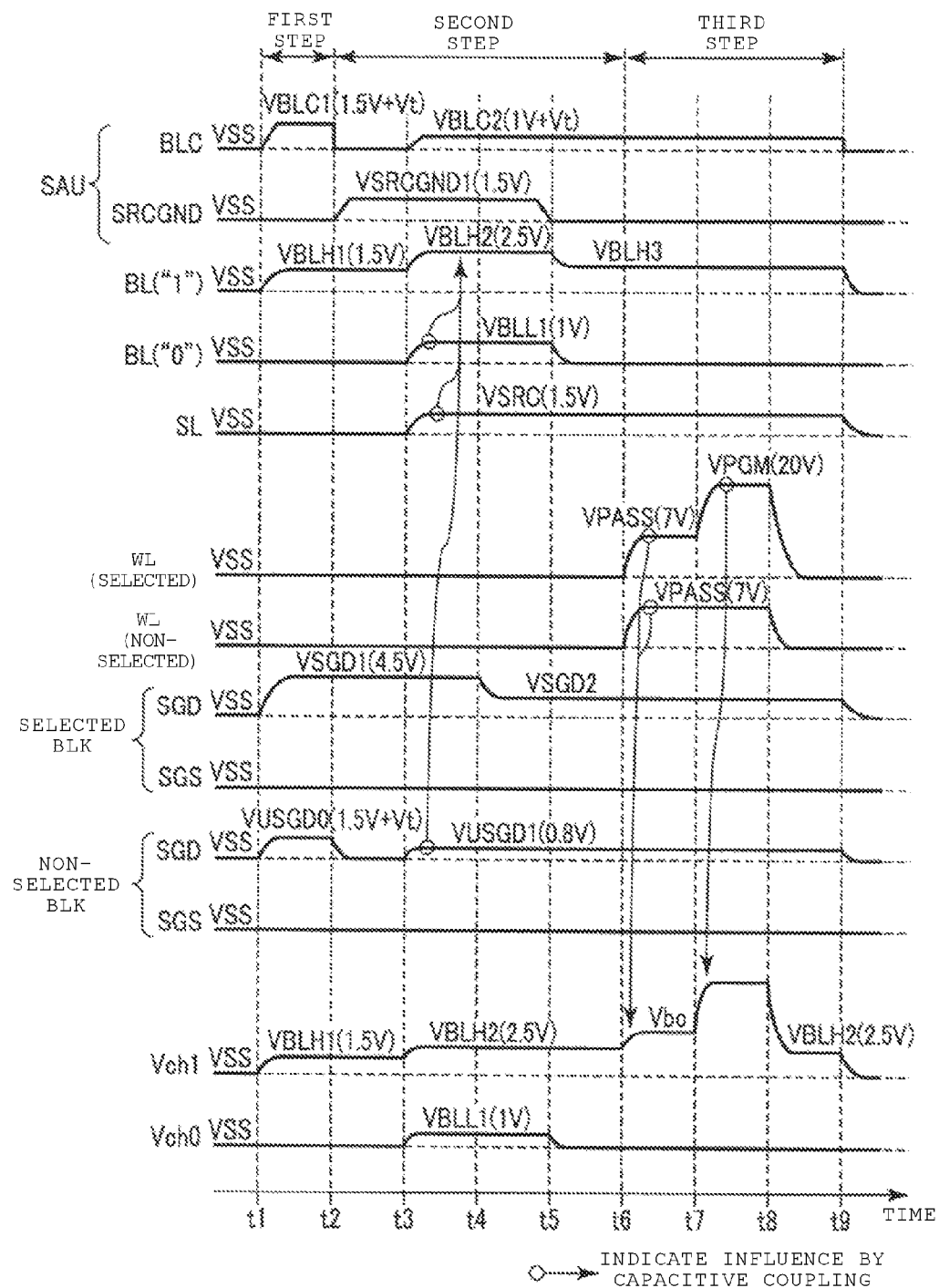
FIG. 20 is a timing diagram illustrating a potential of various lines during writing of a semiconductor memory device according to a modification example of the first embodiment.

For example, in the above-mentioned embodiment, a potential of a channel of a NAND string 116 of a non-selected block BLK may be increased before VUSGD1 is applied to a select gate line SGD of the non-selected block BLK. This example is illustrated in FIG. 20.

As illustrated in the drawing, at a first step (time t1), the row decoder 112 applies a voltage VUSGD0 (for example, 1.5 V+Vt_st) to a select gate line SGD of a non-selected block BLK. The voltage VUSGD0, which is a voltage applied to the select gate line SGD of the non-selected block BLK, has a relation of VUSGD0>VUSGD1, and may be the same voltage as, for example, VSGD1 (for example, 4.5 V). Thereby, a select transistor ST1 of the non-selected block BLK is set to be in an on state, and a channel potential of a NAND string 116 connected to a bit line BL ("1") in the non-selected block BLK increases to 1.5 V which is the same as a channel potential Vch1 of the NAND string 116 connected to the bit line BL ("1") in a selected block BLK. Thereby, at time t3, when VUSGD1 (for example, 0.8 V) is applied to the select gate line SGD of the non-selected block BLK, it is possible to suppress the erroneous operation of the select transistor ST1 corresponding to writing of "1" in the non-selected block BLK.

In addition, it is possible to use, for example, a voltage sense type sense amplifier for the above-mentioned embodiment. In this case, a sense amplifier unit SAU is provided for every two bit lines BL of an even bit line BLe and an odd bit line BLo. Accordingly, a potential of a bit line BL which is not electrically connected to the sense amplifier unit SAU is appropriately set, and thus capacitive coupling between a bit line BL which is electrically connected to the sense amplifier unit SAU and a bit line BL which is not connected thereto may be used.

The above-mentioned embodiment may also be applied to a three-dimensional stacked NAND type flash memory which is different from that in the second embodiment. For example, a configuration may be adopted in which a semiconductor layer of a NAND string 116 is a U-shaped layer toward the upper side of a semiconductor substrate, or a configuration may be adopted in which NAND strings 116 each of which includes memory cell transistors MT being arrayed in a planar direction of a semiconductor substrate are sequentially stacked toward the upper side of a semiconductor substrate.

Further, the term "connection" in the above-mentioned embodiment also includes indirect connection through something else, for example, a transistor or a resistor.

Meanwhile, the embodiments related to the invention may be as follows.

1) In a read operation,

A time (tR) of a read operation may be in a range between, for example, 25 μs and 38 μs, 38 μs and 70 μs, or 70 μs and 80 μs.

(2) A write operation includes a programming operation and a verifying operation as described above. In the write operation, a voltage which is first applied to a selected word line during the programming operation is in a voltage between, for example, 13.7 V and 14.3V. However, the exemplary embodiment is not limited thereto, and the voltage may be in a range between, for example, 13.7 V and 14.0 V or 14.0 V and 14.6 V.

A voltage which is first applied to a selected word line when an odd-numbered word line is written may be changed with a voltage which is first applied to a selected word line when an even-numbered word line is written.

When the programming operation is performed using an incremental step pulse program (ISPP) method, for example, approximately 0.5 V is used as a step-up voltage.

A voltage which is applied to a non-selected word line may be in a range between, for example, 6.0 V and 7.3 V. The exemplary embodiment is not limited to this case, and the voltage may be in a range between, for example, 7.3 V and 8.4 V or may be set to be equal to or less than 6.0 V.

A path voltage to be applied may be changed according to whether a non-selected word line is an odd-numbered word line or an even-numbered word line.

A time (tProg) of the write operation may be in a range between, for example, 1,700 μs and 1,800 μs, 1,800 μs and 1,900 μs, or 1,900 μs and to 2,000 μs.

(3) In an erasing operation, a voltage first applied to a well which is formed in an upper portion of a semiconductor substrate and has the above-mentioned memory cell formed thereon is in a range between, for example, 12 V and 13.6 V. The exemplary embodiment is not limited to this case, and the voltage may be in a range between, for example, 13.6 V and 14.8 V, 14.8 V and 19.0 V, 19.0 and 19.8 V, or 19.8 V and 21 V. A time (tErase) of the erasing operation may be in a range between, for example, 3,000 μs and 4,000 μs, 4,000 μs and 5,000 μs, or 4,000 μs and 9,000 μs.

4) The memory cell has a structure in which a charge storage layer is arranged on a semiconductor substrate (silicon substrate) through a tunnel insulating film having a film thickness of 4 nm to 10 nm. The charge storage layer may have a stacked structure of an insulating film such as SiN or SiON which has a film thickness of 2 nm to 3 nm and polysilicon having a film thickness of 3 nm to 8 nm. In addition, a metal such as Ru may be added to polysilicon. An insulating film may be provided on the charge storage layer. For example, the insulating film includes a silicon oxide film having a film thickness of 4 nm to 10 nm which is interposed between a lower High-k film having a film thickness of 3 nm to 10 nm and an upper High-k film having a film thickness of 3 nm to 10 nm. Examples of the High-k film include HfO and the like. In addition, the silicon oxide film may have a film thickness larger than that of the High-k film. A control electrode having a film thickness of 30 nm to 70 nm is formed on the insulating film through a material which has a film thickness of 3 nm to 10 nm. Here, such a material is a metal oxide film such as TaO or a metal nitride film such as TaN. Here, W or the like may be used as the control electrode.

In addition, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a first block including a first memory string that includes a first memory cell transistor and a first select transistor;
    a second block including a second memory string that includes a second memory cell transistor and a second select transistor;
    a first select gate line that is electrically connected to a gate of the first select transistor; and
    a second select gate line that is electrically connected to a gate of the second select transistor,
    wherein during writing of data to a memory cell transistor in the first block, a first voltage is applied to the first select gate line during a first time period, a second voltage is applied to the second select gate line during a second time period after the first time period, and a third voltage lower than the first voltage is applied to the first select gate line during a third time period after the second time period.

2. The device according to claim 1, further comprising:
    a first bit line electrically connected to a first end of the first memory string and a first end of the second memory string;
    a second bit line electrically connected to a first end of a third memory string in the first block and a first end of a fourth memory string in the second block;
    a first sense amplifier having a first transistor that is turned on and off to electrically connect and disconnect an internal node of the first sense amplifier and the first bit line; and
    a second sense amplifier having a second transistor that is turned on and off to electrically connect and disconnect an internal node of the second sense amplifier and the second bit line, wherein
    the first transistor is turned on during the first time period and turned off during the second time period.

3. The device according to claim 2, wherein the second transistor is turned on during the first time period and the second time period.

4. The device according to claim 3, further comprising:
a source line that is electrically connected to second ends of the first, second, third, and fourth memory strings,
wherein during the second time period, voltages applied to the second bit line, the source line, and the second select gate line are increased.

5. The device according to claim 4, wherein
the voltage applied to the second bit line is decreased during a fourth time period after the third time period, while the voltages applied to the source line and the second select gate line are maintained.

6. The device according to claim 2, wherein
during the writing of data and prior to the first time period, the first voltage is applied to the first and second bit lines and then during the first time period, the first bit line is maintained at the first voltage while the second bit line is discharged.

7. The device according to claim 1, further comprising:
a first word line that is electrically connected to a gate of the first memory cell transistor; and
a second word line that is electrically connected to a gate of the second memory cell transistor, wherein
during the writing of data, a fourth voltage higher than any of the first, second, and third voltages is applied to the first word line while the third voltage is applied to the first select gate line.

8. The device according to claim 7, wherein
during the writing of data and while the third voltage is applied to the first select gate line, a fifth voltage that is lower than the fourth voltage but higher than any of the first, second, and third voltages is applied to the first and second word lines before the fourth voltage is applied to the first word line.

9. The device according to claim 1, wherein the first and second blocks include a plurality of memory cell transistors that are arranged on a plane.

10. The device according to claim 1, wherein the first and second blocks include a plurality of memory cell transistors that are three-dimensionally arranged above a well region.

11. A method of writing data in a semiconductor memory device including a first block including a first memory string that includes a first memory cell transistor and a first select transistor, a second block including a second memory string that includes a second memory cell transistor and a second select transistor, a first select gate line that is electrically connected to a gate of the first select transistor, and a second select gate line that is electrically connected to a gate of the second select transistor, said method comprising:
performing a coarse writing operation to a memory cell transistor in the first block; and then
performing a fine writing operation to the memory cell transistor, wherein
at least one of the coarse and fine writing operations include the steps of:
applying a first voltage to the first select gate line during a first time period;
applying a second voltage to the second select gate line during a second time period after the first time period; and
applying a third voltage lower than the first voltage to the first select gate line during a third time period after the second time period.

12. The method according to claim 11, wherein the semiconductor memory device further comprises:

a first bit line electrically connected to a first end of the first memory string and a first end of the second memory string;
a second bit line electrically connected to a first end of a third memory string in the first block and a first end of a fourth memory string in the second block;
a first sense amplifier having a first transistor that is turned on and off to electrically connect and disconnect an internal node of the first sense amplifier and the first bit line; and
a second sense amplifier having a second transistor that is turned on and off to electrically connect and disconnect an internal node of the second sense amplifier and the second bit line, wherein
the first transistor is turned on during the first time period and turned off during the second time period.

13. The method according to claim 12, wherein the second transistor is turned on during the first time period and the second time period.

14. The method according to claim 13, wherein the semiconductor memory device further comprises:
a source line that is electrically connected to second ends of the first, second, third, and fourth memory strings,
wherein during the second time period, voltages applied to the second bit line, the source line, and the second select gate line are increased.

15. The method according to claim 14, wherein
the voltage applied to the second bit line is decreased during a fourth time period after the third time period, while the voltages applied to the source line and the second select gate line are maintained.

16. The method according to claim 12, wherein
during the writing of data and prior to the first time period, the first voltage is applied to the first and second bit lines and then during the first time period, the first bit line is maintained at the first voltage while the second bit line is discharged.

17. The method according to claim 11, wherein the semiconductor memory device further comprises:
a first word line that is electrically connected to a gate of the first memory cell transistor; and
a second word line that is electrically connected to a gate of the second memory cell transistor, wherein
during the writing of data, a fourth voltage higher than any of the first, second, and third voltages is applied to the first word line while the third voltage is applied to the first select gate line.

18. The method according to claim 17, wherein
during the writing of data and while the third voltage is applied to the first select gate line, a fifth voltage that is lower than the fourth voltage but higher than any of the first, second, and third voltages is applied to the first and second word lines before the fourth voltage is applied to the first word line.

19. The method according to claim 11, wherein the first and second blocks include a plurality of memory cell transistors that are arranged on a plane.

20. The method according to claim 11, wherein the first and second blocks include a plurality of memory cell transistors that are three-dimensionally arranged above a well region.

* * * * *